US012765202B2

(12) United States Patent
Hong et al.

(10) Patent No.: US 12,765,202 B2
(45) Date of Patent: Oct. 13, 2026

(54) DISPLAY PANEL INCLUDING A PATTERN LAYER AND ELECTRONIC DEVICE INCLUDING THE SAME

(71) Applicant: Samsung Display Co., Ltd., Yongin-Si (KR)

(72) Inventors: Sungjin Hong, Yongin-si (KR); Sunmi Kang, Yongin-si (KR); Chungsock Choi, Yongin-si (KR); Juhoon Kang, Yongin-si (KR); Jewon Yoo, Yongin-si (KR); Sujin Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 813 days.

(21) Appl. No.: 17/972,554

(22) Filed: Oct. 24, 2022

(65) Prior Publication Data

US 2023/0217758 A1 Jul. 6, 2023

(30) Foreign Application Priority Data

Dec. 31, 2021 (KR) ........................ 10-2021-0194546

(51) Int. Cl.

| | |
|---|---|
| ***H10K 59/131*** | (2023.01) |
| ***H10D 86/40*** | (2025.01) |
| ***H10D 86/60*** | (2025.01) |
| ***H10K 59/121*** | (2023.01) |

(52) U.S. Cl.

CPC ....... *H10K 59/1315* (2023.02); *H10D 86/441* (2025.01); *H10D 86/60* (2025.01); *H10K 59/1213* (2023.02)

(58) Field of Classification Search

CPC ........... H10K 59/1315; H10K 59/1213; H10K 59/124; H10K 50/824; H10K 59/121; H10K 59/122; H10K 59/131; H10K 59/352; H10D 86/441; H10D 86/60

See application file for complete search history.

(56) References Cited

U.S. PATENT DOCUMENTS 7,688,511 B2 3/2010 Komatsu et al.
8,174,633 B2 * 5/2012 Segawa ............. G02F 1/136209 349/44
8,710,527 B2 4/2014 Moon et al.
11,515,375 B2 * 11/2022 Zhang .................. H10K 59/126

(Continued)

FOREIGN PATENT DOCUMENTS

CN 111883565 A 11/2020
KR 10-1117363 B1 3/2012

(Continued)

*Primary Examiner* — Tan N Tran

(74) *Attorney, Agent, or Firm* — Innovation Counsel LLP

(57) ABSTRACT

A display panel includes: a substrate including a main display area, a component area, and a peripheral area; a main pixel circuit and a main display element connected to the main pixel circuit, the main pixel circuit and the main display element being located in the main display area; an auxiliary display element located in the component area; a an auxiliary pixel circuit located in an area other than the component area not to overlap the auxiliary display element; and a pattern layer arranged between the substrate and the auxiliary display element to overlap the auxiliary display element, the pattern layer including a plurality of patterns having a concentric shape in a plan view.

24 Claims, 33 Drawing Sheets

(56) References Cited

U.S. PATENT DOCUMENTS

| | | | | |
|---|---|---|---|---|
| 11,963,398 | B2 * | 4/2024 | Yang | H10K 59/1213 |
| 12,289,955 | B2 * | 4/2025 | Han | H10D 86/441 |
| 2013/0063022 | A1 | 3/2013 | Park et al. | |
| 2021/0367020 | A1 | 11/2021 | Bok et al. | |
| 2022/0285475 | A1 | 9/2022 | Hong et al. | |

FOREIGN PATENT DOCUMENTS

| | | | |
|---|---|---|---|
| KR | 10-2013-0028532 | A | 3/2013 |
| KR | 10-1884737 | B1 | 8/2018 |
| KR | 10-2021-0145896 | A | 12/2021 |

* cited by examiner

DISPLAY PANEL INCLUDING A PATTERN LAYER AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0194546, filed on Dec. 31, 2021, in the Korean Intellectual Property Office, the disclosure of which is incorporated by reference herein in its entirety.

BACKGROUND

1. Field

One or more embodiments relate to a display panel and an electronic device including the same, and more particularly, to a display panel capable of providing high-quality images and improving the quality of images output through a component, and an electronic device including the display panel.

2. Description of the Related Art

Display panels are devices for visually displaying data. Recently, display panels have been used for various purposes. As thicknesses and weights of display panels have decreased, the range of applications of display panels has increased.

In order to increase an area occupied by a display area and add various functions, research has been conducted on display panels for adding various functions in addition to image display through the display area.

SUMMARY

One or more embodiments provide structures of a display panel including a transmissive area in a display area and an electronic device including the display panel.

However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display panel includes a substrate including a main display area, a component area, and a peripheral area, a main pixel circuit and a main display element connected to the main pixel circuit, the main pixel circuit and the main display element being located in the main display area, an auxiliary pixel circuit located in an area other than the component area not to overlap the auxiliary display element, a connection wiring connecting the auxiliary display element to the auxiliary pixel circuit, and a pattern layer arranged between the substrate and the auxiliary display element to overlap the auxiliary display element, the pattern layer including a plurality of patterns having a concentric shape in a plan view.

The pattern layer may include a metal material.

The plurality of patterns may have a first linewidth and a first separation distance, wherein the first separation distance is the first separation distance is greater than or equal to the first line width.

The first separation distance may be is less than or equal to twice the first line width.

The first linewidth may be greater than or equal to 1.2 μm and less than or equal to 3.0 μm.

A constant voltage may be applied to the pattern layer.

The auxiliary display element may include an auxiliary pixel electrode, an auxiliary counter electrode disposed on the auxiliary pixel electrode, and an auxiliary intermediate layer located between the auxiliary pixel electrode and the auxiliary counter electrode, wherein the pattern layer is electrically connected to the auxiliary pixel electrode.

The pattern layer may include an inorganic insulating material.

The plurality of patterns may have a first linewidth and a first separation distance, wherein the first linewidth is greater than or equal to 2.0 μm and less than or equal to 4.0 μm.

The connection wiring may at least partially overlap the pattern layer, and an insulating layer may be interposed between the connection wiring and the pattern layer.

The auxiliary display element may include an auxiliary pixel electrode, an auxiliary counter electrode disposed on the auxiliary pixel electrode, and an auxiliary intermediate layer located between the auxiliary pixel electrode and the auxiliary counter electrode, wherein a width of the pattern layer is less than or equal to a width of the auxiliary pixel electrode.

The pattern layer may include a first pattern layer including a metal material and a second pattern layer including an inorganic insulating material.

The first pattern layer may include a plurality of first patterns having a concentric shape in a plan view, and the second pattern layer may include a plurality of second patterns having a concentric shape in the plan view, wherein the plurality of first patterns and the plurality of second patterns overlap each other.

The first pattern layer may include a plurality of first patterns having a concentric shape in a plan view, and the second pattern layer may include a plurality of second patterns having a concentric shape in the plan view, wherein the plurality of first patterns are located between the plurality of second patterns.

The pattern layer may further include a plurality of connection patterns respectively connecting adjacent patterns of the plurality of patterns.

The plurality of connection patterns may not be located on a same line.

Each of the plurality of patterns may be floated.

According to one or more embodiments, an electronic device includes a display panel including a main display area, a component area, and a peripheral area, and a component arranged under the display panel to correspond to the component area, wherein the display panel includes a substrate, a main pixel circuit and a main display element connected to the main pixel circuit, the main pixel circuit and the main display element being located in the main display area, an auxiliary display element located in the component area, an auxiliary pixel circuit located in an area other than the component area not to overlap the auxiliary display element, a connection wiring connecting the auxiliary display element to the auxiliary pixel circuit, and a pattern layer arranged between the substrate and the auxiliary display element to overlap the auxiliary display element, the pattern layer including a plurality of patterns having a concentric shape in a plan view.

The pattern layer may include at least one of a metal material and an inorganic insulating material.

The plurality of patterns may have a first linewidth and a first separation distance, wherein a ratio between the first linewidth and the first separation distance ranges from 1:1 to 1:2.

The pattern layer may be electrically connected to a wiring to which a constant voltage is applied, or may be electrically connected to the auxiliary display element.

The auxiliary display element may include an auxiliary pixel electrode, an auxiliary counter electrode disposed on the auxiliary pixel electrode, and an auxiliary intermediate layer located between the auxiliary pixel electrode and the auxiliary counter electrode, wherein a width of the pattern layer is less than or equal to a width of the auxiliary pixel electrode.

The pattern layer may include a first pattern layer including a metal material and a plurality of first patterns having a concentric shape, and a second pattern layer including an inorganic insulating material and having a concentric shape.

The pattern layer may further include a plurality of connection patterns connecting adjacent patterns of the plurality of patterns.

Other aspects, features, and advantages of the disclosure will become more apparent from the drawings, the claims, and the detailed description.

BRIEF DESCRIPTION OF THE DRAWINGS

The above and other aspects, features, and advantages of certain embodiments will be more apparent from the following description taken in conjunction with the accompanying drawings, in which:

FIGS. 21, 22, 23, 24 and 25 are cross-sectional views illustrating the pattern layer of FIG. 6A or the like.

DETAILED DESCRIPTION

Figure 1A:
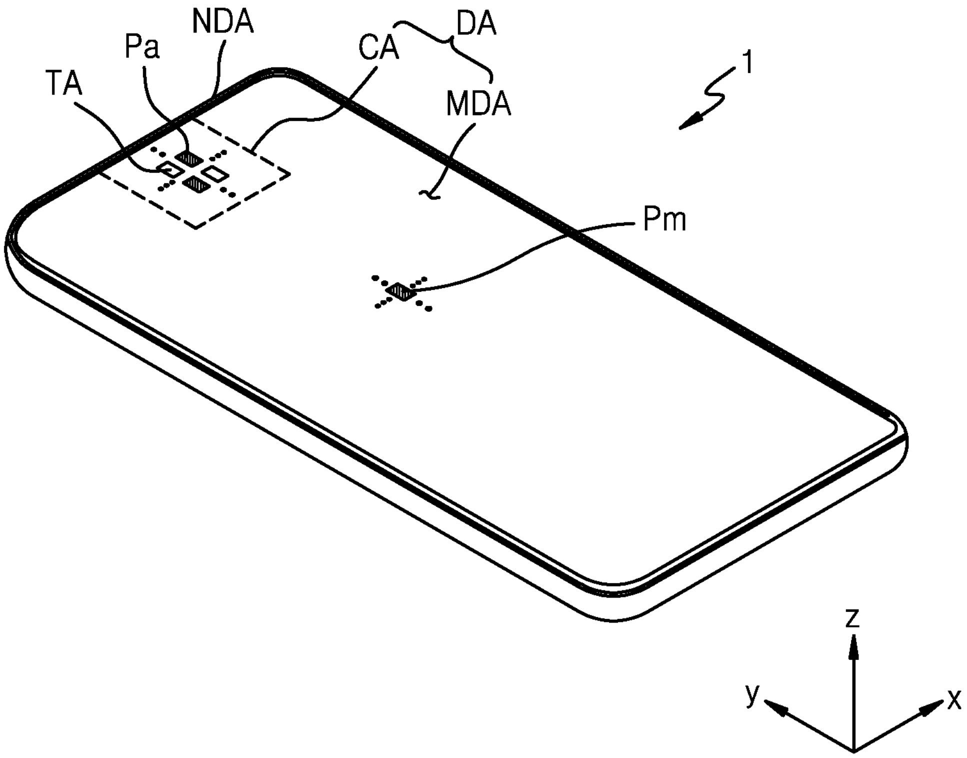
FIGS. 1A, 1B and 1C are perspective views illustrating an electronic device, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

In the specification, while such terms as "first," "second," etc., may be used to describe various components, such components are not be limited to the above terms. The above terms are used only to distinguish one component from another.

The singular forms "a," "an," and "the" as used herein are intended to include the plural forms as well unless the context clearly indicates otherwise.

In the specification, it is to be understood that the terms "including," "having," and "comprising" are intended to indicate the existence of features or components described in the specification, and are not intended to preclude the possibility that one or more other features or components may be added.

In the specification, it will be further understood that, when a layer, region, or component is referred to as being "on" another layer, region, or component, it may be directly on the other layer, region, or component, or may be indirectly on the other layer, region, or component with intervening layers, regions, or components therebetween.

In the specification, it will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

"A and/or B" is used herein to select only A, select only B, or select both A and B. "At least one of A and B" is used to select only A, select only B, or select both A and B.

In the specification, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the specification, when a certain embodiment may be implemented differently, a specific process order may be different from the described order. For example, two consecutively described processes may be performed substantially at the same time or may be performed in an order opposite to the described order.

Sizes of components in the drawings may be exaggerated or contracted for convenience of explanation. For example, because sizes and thicknesses of elements in the drawings are arbitrarily illustrated for convenience of explanation, the disclosure is not limited thereto.

Figure 1B:
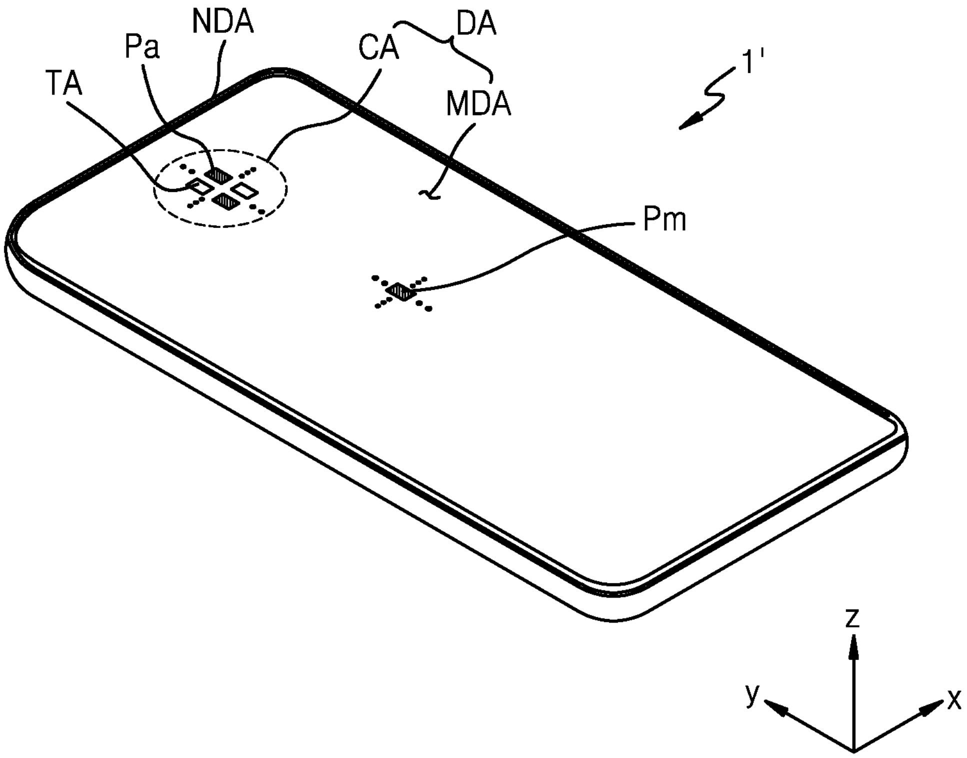
Figure 1C:
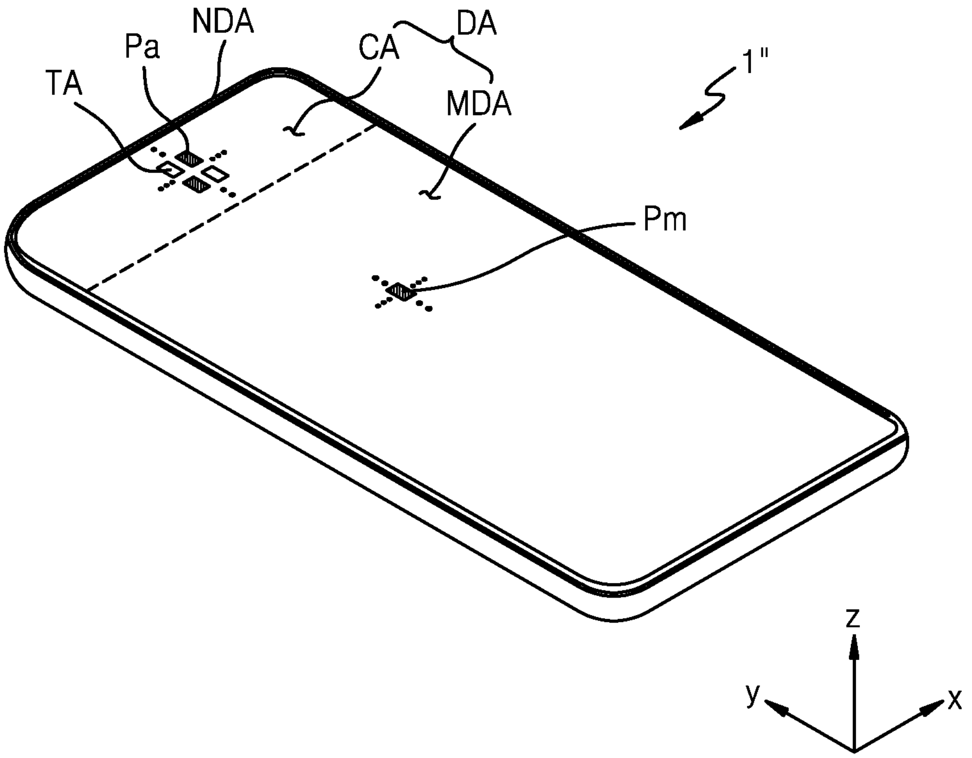

FIGS. 1A through 1C are perspective views illustrating an electronic device, according to an embodiment.

Referring to FIGS. 1A through 1C, an electronic device 1, 1', or 1 includes a display area DA and a peripheral area NDA outside the display area DA. The display area DA includes a component area CA and a main display area MDA at least partially surrounding the component area CA. The component area CA may display an auxiliary image and the main display area MDA may display a main image, and thus, the component area CA and the main display area MDA may display an image individually or together. The peripheral area NDA may be a non-display area where display elements are not located. The display area DA may be entirely surrounded by the peripheral area NDA.

FIG. 1A illustrates that the main display area MDA surrounds at least a part of one component area CA. In another embodiment, the electronic device 1 may include two or more component areas CA, and shapes and sizes of the plurality of component areas CA may be different from one another. When viewed in a direction substantially perpendicular to a top surface of the electronic device 1, the component area CA may have any of various shapes such as a circular shape, an elliptical shape, a polygonal shape such as a quadrangular shape, a star shape, or a diamond shape. Although the component area CA is located at the center on an upper portion of the main display area MDA having a substantially quadrangular shape when viewed in the direction substantially perpendicular to the top surface of the electronic device 1 in FIG. 1A, the component area CA may be located on a side portion of the main display area MDA having the quadrangular shape, for example, on an upper right portion or an upper left portion of the main display area MDA. For example, the component area CA having a circular shape may be located in the main display area MDA as shown in FIG. 1B, or the component area CA having a rectangular bar shape may be located on a side portion of the main display area MDA as shown in FIG. 1C.

The electronic device 1 may provide an image by using a plurality of main sub-pixels Pm located in the main display area MDA and a plurality of auxiliary sub-pixels Pa located in the component area CA.

In the component area CA, a component 40 that is an electronic element may be located under a display panel to correspond to the component area CA, as described below with reference to FIGS. 2A and 2B.

The component 40 may be an electronic element using light or sound. For example, the electronic element may be a sensor that measures a distance such as a proximity sensor, a sensor that recognizes a user's body part (e.g., fingerprint, iris, or face), a small lamp that outputs light, or an image sensor (e.g., a camera) that captures an image. The electronic element using light may use light of any of various wavelength bands such as visible light, infrared light, or ultraviolet light. The electronic element using sound may use ultrasound or sound of another frequency band. In some embodiments, the component 40 may include sub-components such as a light emitter and a light receiver. The light emitter and the light receiver may be integrated or may be physically separated, to constitute one component 40. In order to minimize a function of the component 40 from being limited, the component area CA may include a transmissive area TA through which light and/or sound output from the component 40 to the outside or traveling from the outside toward the component 40 may be transmitted.

In the case of the display panel and the electronic device including the same according to an embodiment, when light is transmitted through the component area CA, a light transmittance may be greater than or equal to about 10%, and more preferably, greater than or equal to about 40%, about 25%, about 50%, about 85%, or about 90%.

The plurality of auxiliary sub-pixels Pa may be located in the component area CA. The plurality of auxiliary sub-pixels Pa may emit light to provide a certain image. An image displayed in the component area CA which is an auxiliary image may have a resolution lower than that of an image displayed in the main display area MDA. That is, the component area CA may include the transmissive area TA through which light and sound may be transmitted, and when a sub-pixel is not located in the transmissive area TA, the number of auxiliary sub-pixels Pa that may be located per unit area may be less than the number of main sub-pixels Pm located per unit area in the main display area MDA.

Hereinafter, although an organic light-emitting display apparatus is described as the electronic device 1 according to an embodiment, the display apparatus of the disclosure is not limited thereto. In another embodiment, the electronic device 1 may be an inorganic light-emitting display, an inorganic electroluminescent (EL) display, or a quantum dot light-emitting display. For example, an emission layer of a display element included in the electronic device 1 may include an organic material, may include an inorganic material, may include quantum dots, may include an organic material and quantum dots, or may include an inorganic material and quantum dots.

Figure 2A:
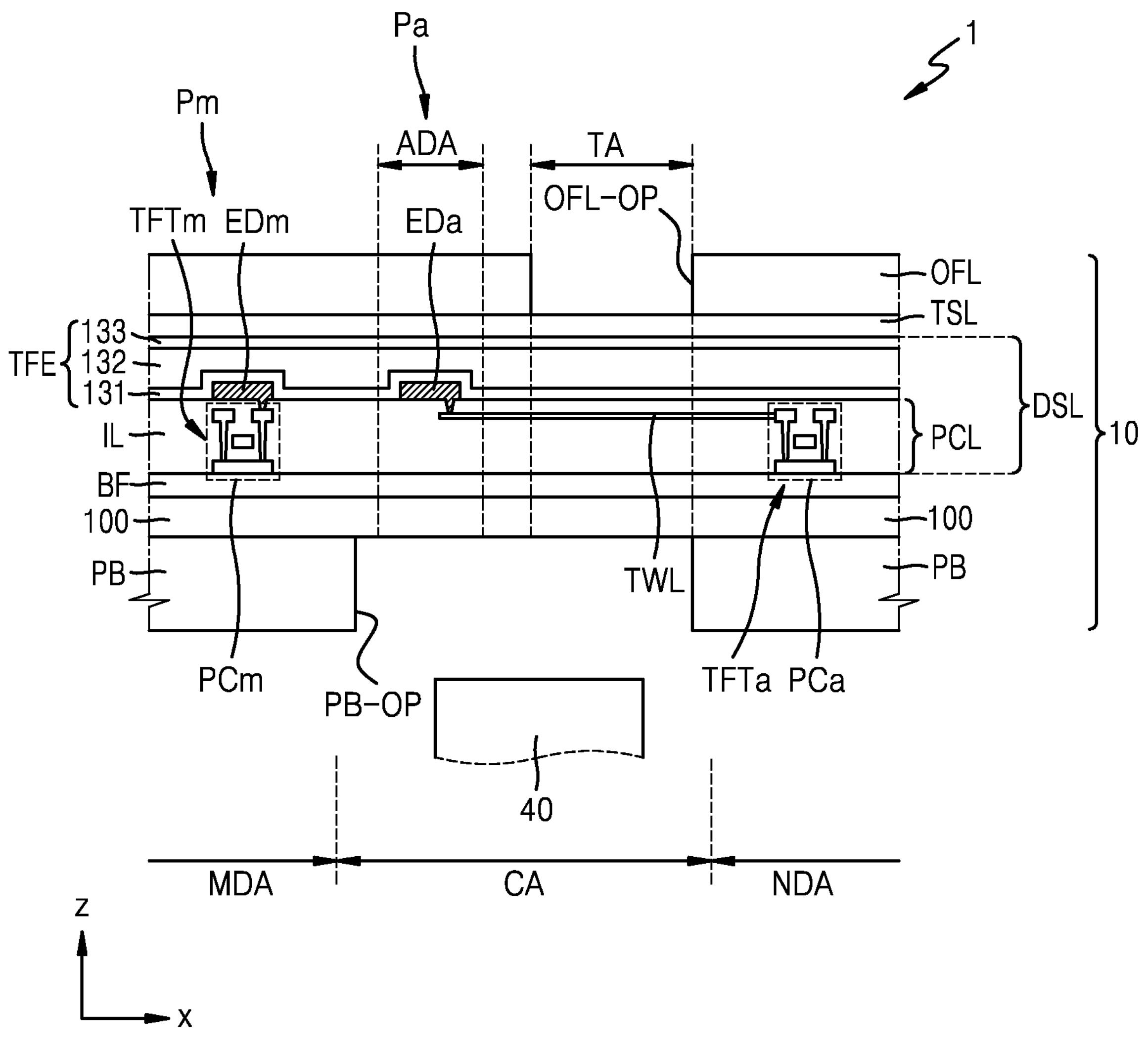
FIGS. 2A and 2B are cross-sectional views illustrating part of an electronic device, according to embodiments.
Figure 2B:
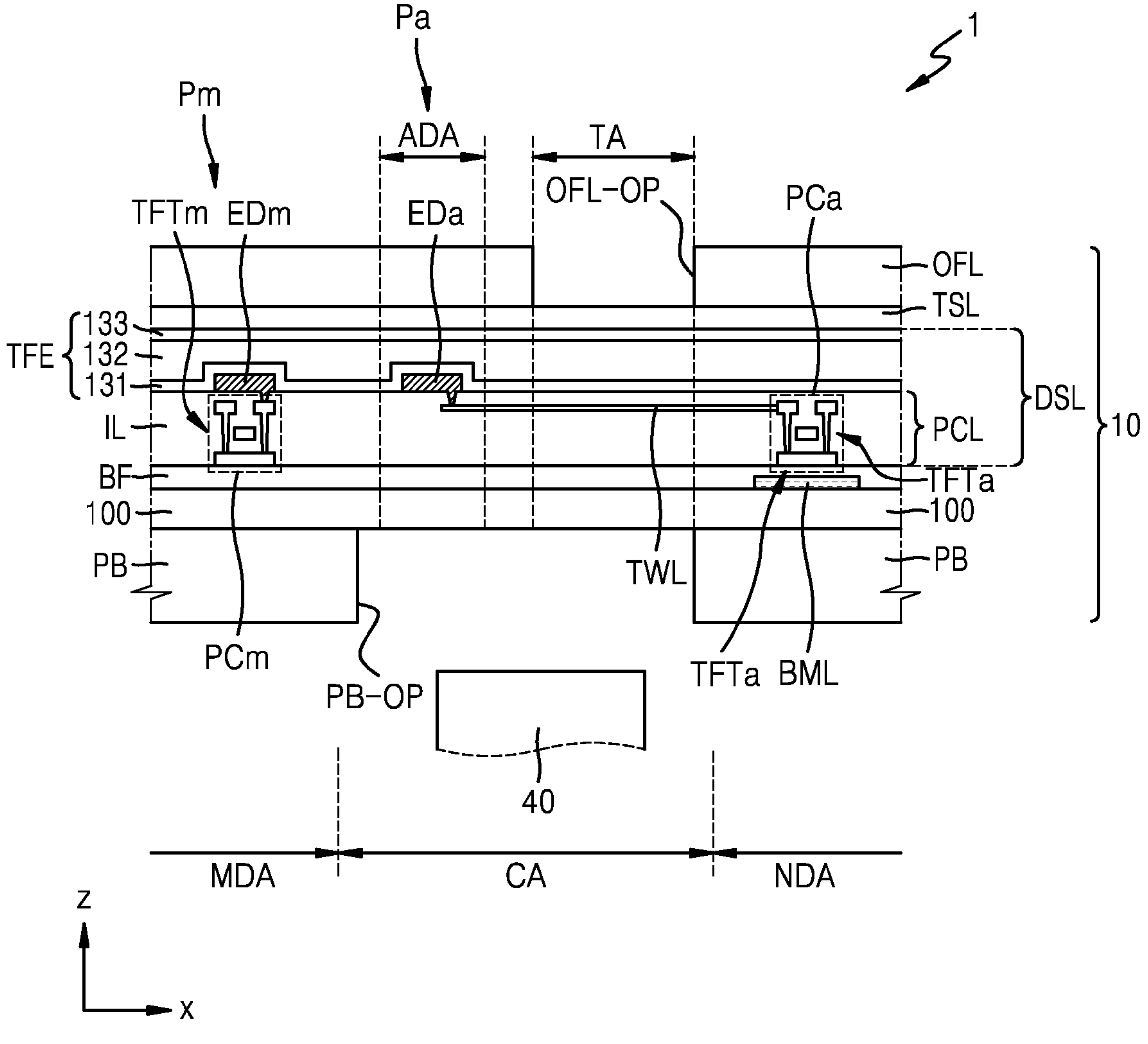

FIGS. 2A and 2B are cross-sectional views illustrating a part of an electronic device, according to embodiments.

Referring to FIG. 2A, the electronic device 1 may include a display panel 10 and the component 40 overlapping the display panel 10. A cover window (not shown) that protects the display panel 10 may be further located on the display panel 10.

The display panel 10 includes the component area CA that is an area overlapping the component 40 and the main display area MDA where a main image is displayed. The display panel 10 may include a substrate 100, a display layer DSL, a touchscreen layer TSL, and an optical functional layer OFL which are located over the substrate 100, and a panel protector PB that is located under the substrate 100.

The display layer DSL may include a circuit layer PCL including main and auxiliary thin-film transistors TFTm and TFTa, main and auxiliary light-emitting devices EDm and EDa that are display elements, and a protection layer such as a thin-film encapsulation layer TFE or a sealing substrate (not shown). A buffer layer BF may be located between the substrate 100 and the circuit layer PCL and an insulating layer IL may be located in the circuit layer PCL.

The substrate 100 may be formed of an insulating material such as glass, quartz, or a polymer resin. The substrate 100 may be a rigid substrate, or a flexible substrate that is bendable, foldable, or rollable.

The main light-emitting device EDm and a main pixel circuit PCm connected to the main light-emitting device EDm may be located in the main display area MDA of the display panel 10. The main pixel circuit PCm may include at least one main thin-film transistor TFTm and may control an operation of the main light-emitting device EDm. A main sub-pixel Pm may display an image by light emission of the main light-emitting device EDm.

The auxiliary light-emitting device EDa may be located in the component area CA of the display panel 10 to form an auxiliary sub-pixel Pa. In the present embodiment, an auxiliary pixel circuit PCa for driving the auxiliary light-emitting device EDa may not be located in the component area CA, but may be located in the peripheral area NDA that is a non-display area. However, various modifications may be made. For example, in another embodiment, the auxiliary pixel circuit PCa may be located in a portion of the main display area MDA, or may be located between the main display area MDA and the component area CA. That is, the auxiliary pixel circuit PCa may not overlap the auxiliary light-emitting device EDa.

The auxiliary pixel circuit PCa may include at least one auxiliary thin-film transistor TFTa and may be electrically connected to the auxiliary light-emitting device EDa by a connection wiring TWL. The connection wiring TWL may be formed of a transparent conductive material. The auxiliary pixel circuit PCa may control an operation of the auxiliary light-emitting device EDa. The auxiliary sub-pixel Pa may display an image by light emission of the auxiliary light-emitting device EDa.

A portion of the component area CA where the auxiliary light-emitting device EDa is located may be defined as an auxiliary display area ADA and a portion of the component area CA where the auxiliary light-emitting device EDa is not located may be defined as the transmissive area TA.

The transmissive area TA may be an area through which light/a signal emitted from the component 40 located to correspond to the component area CA or light/a signal incident on the component 40 is transmitted. The auxiliary display area ADA and the transmissive area TA may be alternately located in the component area CA. The connection wiring TWL that connects the auxiliary pixel circuit PCa to the auxiliary light-emitting device EDa may be located in the transmissive area TA. Because the connection wiring TWL may be formed of a transparent conductive material having a high transmittance, although the connection wiring TWL is located in the transmissive area TA, a transmittance of the transmissive area TA may be ensured. In the present embodiment, because the auxiliary pixel circuit PCa is not located in the component area CA, the area of the transmissive area TA may be easily increased and a light transmittance may be further increased.

The main light-emitting device EDm and the auxiliary light-emitting device EDa may be covered by the thin-film encapsulation layer TFE as shown in FIG. 2A or a sealing substrate. In an embodiment, the thin-film encapsulation layer TFE may include at least one inorganic encapsulation layer and at least one organic encapsulation layer as shown in FIG. 2A. For example, the thin-film encapsulation layer TFE may include first and second inorganic encapsulation layers 310 and 330, and an organic encapsulation layer 320 disposed between the first and second inorganic encapsulation layers 310 and 330.

Each of the first inorganic encapsulation layer 310 and the second inorganic encapsulation layer 330 may include at least one inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$) (zinc oxide ($ZnO_x$) may be zinc oxide (ZnO) and/or zinc peroxide ($ZnO_2$)), and may be formed by using chemical vapor deposition (CVD) or the like. The organic encapsulation layer 320 may include a polymer-based material. Examples of the polymer-based material may include a silicon-based resin, an acrylic resin (e.g., polymethyl methacrylate or polyacrylic acid), an epoxy resin, polyimide, and polyethylene.

The first inorganic encapsulation layer 310, the organic encapsulation layer 320, and the second inorganic encapsulation layer 330 may be integrally formed to cover the main display area MDA and the component area CA.

When the main and auxiliary light-emitting devices EDm and EDa are sealed with a sealing substrate (not shown), the sealing substrate may face the substrate 100 with the main and auxiliary light-emitting devices EDm and EDa disposed therebetween. There may be a gap between the sealing substrate and the main and auxiliary light-emitting devices EDm and EDa. The sealing substrate may include glass. A sealant such as a frit may be located between the substrate 100 and the sealing substrate, and may be located in the peripheral area NDA. The sealant located in the peripheral area NDA may surround the display area DA and may prevent penetration of moisture through a side surface.

The touchscreen layer TSL may obtain coordinate information according to an external input, for example, a touch event. The touchscreen layer TSL may include a touch electrode and touch wirings connected to the touch electrode. The touchscreen layer TSL may detect an external input by using a self-capacitive method or a mutual capacitive method.

The touchscreen layer TSL may be formed on the thin-film encapsulation layer TFE. Alternatively, the touchscreen layer TSL may be separately formed on a touch substrate, and then may be coupled to the thin-film encapsulation layer TFE through an adhesive layer such as an optically clear adhesive (OCA). In an embodiment, the touchscreen layer TSL may be formed directly on the thin-film encapsulation layer TFE, and in this case, the adhesive layer may not be located between the touchscreen layer TSL and the thin-film encapsulation layer TFE.

The optical functional layer OFL may include an anti-reflection layer. The anti-reflection layer may reduce a reflectance of light (external light) incident on the electronic device 1.

In an embodiment, the optical functional layer OFL may be a polarizing film. The optical functional layer OFL may have an opening OFL-OP corresponding to the transmissive area TA. Accordingly, a light transmittance of the transmissive area TA may be significantly increased. A transparent material such as an optically clear resin (OCR) or an OCA may be filled in the opening OFL-OP. In another embodiment, the optical functional layer OFL may be provided as a filter plate including a black matrix and color filters.

The panel protector PB may be attached to the bottom of the substrate 100 and may support and protect the substrate 100. The panel protector PB may have an opening PB-OP corresponding to the component area CA. Because the panel protector PB has the opening PB-OP, a light transmittance of the component area CA may be increased. The panel protector PB may include polyethylene terephthalate or polyimide.

The component area CA may be greater than an area where the component 40 is located. Accordingly, the area of the opening PB-OP of the panel protector PB may not be the same as the area of the component area CA. Although the component 40 is spaced apart from a side of the display panel 10 in FIG. 2A, at least a part of the component 40 may be inserted into the opening PB-OP formed in the panel protector PB.

Also, a plurality of components 40 may be located in the component area CA. The plurality of components 40 may have different functions. For example, the components 40 may include at least two of a camera (image pickup device), a solar cell, a flash, a proximity sensor, an illuminance sensor, and an iris sensor.

Although a bottom metal layer BML located under the auxiliary light-emitting device EDa of the component area CA is not illustrated in FIG. 2A, the electronic device 1 according to an embodiment may include the bottom metal layer BML as shown in FIG. 2B. In an embodiment, the bottom metal layer BML may be located between the substrate 100 and the auxiliary pixel circuit PCa in the peripheral area NDA, to overlap the auxiliary pixel circuit PCa. The bottom metal layer BML may prevent externa light from reaching the auxiliary pixel circuit PCa. In another embodiment, the bottom metal layer BML may be formed to correspond to the entire display area DA, and may have a bottom-hole corresponding to the component area CA.

Figure 3:
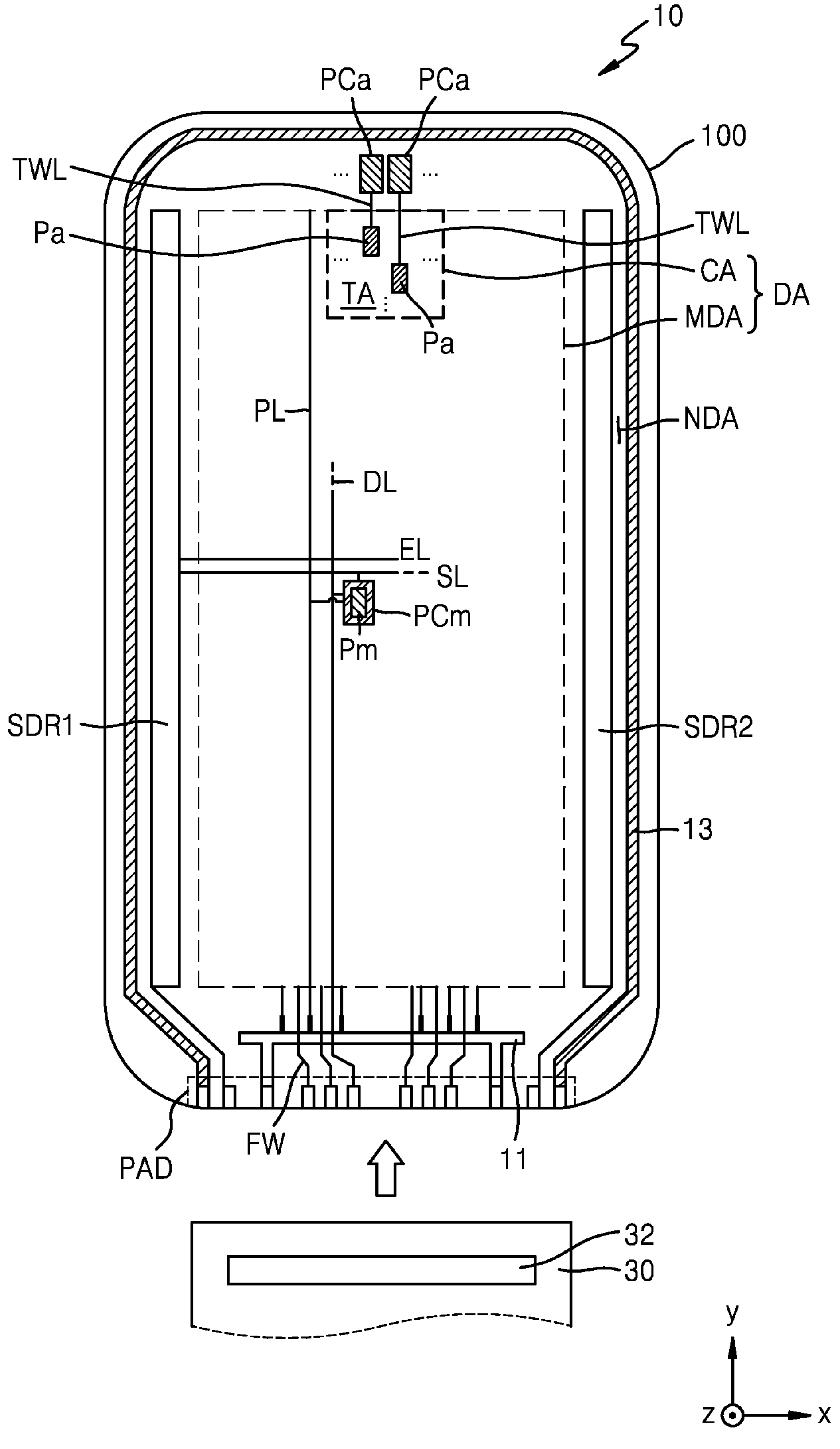
FIG. 3 is a plan view illustrating a display panel that may be included in an electronic device, according to an embodiment.

FIG. 3 is a plan view illustrating a display panel that may be included in an electronic device, according to an embodiment.

Referring to FIG. 3, various elements of the display panel 10 may be located on the substrate 100.

The plurality of main sub-pixels Pm are located in the main display area MDA. Each of the main sub-pixels Pm may be a light-emitting device which includes a display element such as an organic light-emitting diode (OLED). The main pixel circuit PCm for driving the main sub-pixel Pm may be located in the main display area MDA, to overlap the main sub-pixel Pm. Each main sub-pixel Pm may emit, for example, red light, green light, blue light, or white light. The main display area MDA may be covered by a protection layer and may be protected from external air or moisture.

The component area CA may be located on a side portion of the main display area MDA as described above, or may be located inside the display area DA and may be surrounded by the main display area MDA. The plurality of auxiliary sub-pixels Pa are located in the component area CA. Each of the plurality of auxiliary sub-pixels Pa may be a light-emitting device which includes a display element such as an organic light-emitting diode (OLED). Each auxiliary sub-pixel Pa may emit, for example, red light, green light, blue light, or white light. The component area CA may be covered by a protection layer and may be protected from external air or moisture.

The auxiliary pixel circuit PCa for driving the auxiliary sub-pixel Pa may be located in the peripheral area NDA close to the component area CA. For example, when the component area CA is located on an upper portion of the display area DA as shown in FIG. 3, the auxiliary pixel circuit PCa may be located on an upper portion of the peripheral area NDA. The auxiliary pixel circuit PCa and a display element for implementing the auxiliary sub-pixel Pa may be connected to each other by the connection wiring TWL that extends in a direction (e.g., a y direction).

In an embodiment, although the auxiliary pixel circuit PCa is located directly above the component area CA in FIG. 3, the disclosure is not limited thereto. The component area CA may include the transmissive area TA.

The transmissive area TA may surround the plurality of auxiliary sub-pixels Pa. Alternatively, the transmissive areas TA and the plurality of auxiliary sub-pixels Pa may be arranged in a lattice pattern.

Because the component area CA includes the transmissive area TA, a resolution of the component area CA may be lower than a resolution of the main display area MDA. For example, a resolution of the component area CA may be about 1/2, 3/8, 1/3, 1/4, 2/9, 1/8, 1/9, or 1/16 of a resolution of the main display area MDA. For example, a resolution of the main display area MDA may be about 400 ppi or more, and a resolution of the component area CA may be about 200 ppi or about 100 ppi.

The main and auxiliary pixel circuits PCm and PCa for respectively driving the main and auxiliary sub-pixels Pm and Pa may be electrically connected to outer circuits located in the peripheral area NDA. A first scan driving circuit SDR1, a second scan driving circuit SDR2, a terminal area PAD, a driving voltage supply line 11, and a common voltage supply line 13 may be located in the peripheral area NDA.

The first scan driving circuit SDR1 may apply a scan signal to the main pixel circuit PCm for driving the main sub-pixel Pm through a scan line SL. Also, the first scan driving circuit SDR1 may apply an emission control signal to each pixel circuit through an emission control line ELm. The second scan driving circuit SDR2 may be symmetric to the first scan driving circuit SDR1 about the main display area MDA. Some of the main pixel circuits PCm of the main sub-pixels Pm of the main display area MDA may be electrically connected to the first scan driving circuit SDR1 and the others may be electrically connected to the second scan driving circuit SDR2.

The terminal area PAD may be located on a side of the substrate 100. Each pad in the terminal area PAD is exposed without being covered by an insulating layer and is connected to a display circuit board 30. A display driver 32 may be located on the display circuit board 30

The display driver 32 may generate a control signal and supply the control signal to the first scan driving circuit SDR1 and the second scan driving circuit SDR2. The display driver 32 may generate a data signal and the generated data signal may be transmitted to the main pixel circuit PCm through a fan-out wiring FW and a main data line DLm connected to the fan-out wiring FW.

The display driver 32 may supply a driving voltage ELVDD to the driving voltage supply line 11 and may supply a common voltage ELVSS to the common voltage supply line 13. The driving voltage ELVDD may be applied to pixel circuits of the main and auxiliary sub-pixels Pm and Pa through a driving voltage line PL connected to the driving voltage supply line 11, and the common voltage ELVSS may be applied to a counter electrode of a display element connected to the common voltage supply line 13.

The driving voltage supply line 11 may be located below the main display area MDA and may extend in an x-direction. The common voltage supply line 13 may have a loop shape with an open side and may partially surround the main display area MDA.

Although one component area CA is shown in FIG. 3, a plurality of component areas CA may be provided. In this case, the plurality of component areas CA may be spaced apart from one another, and a first camera may be located to correspond to one component area CA and a second camera may be located to correspond to another component area CA. Alternatively, a camera may be located to correspond to one component area CA, and an infrared sensor may be located to correspond to another component area CA. Shapes and sizes of the plurality of component areas CA may be different from one another.

Figure 4A:
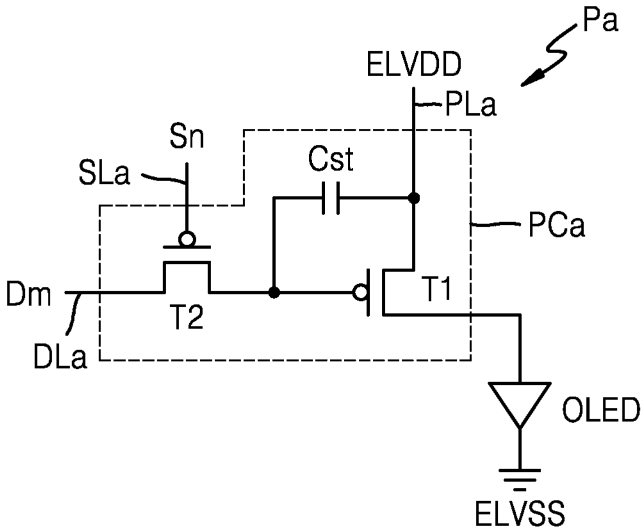
FIGS. 4A and 4B are equivalent circuit diagrams illustrating a pixel that may be included in a display panel, according to an embodiment.
Figure 4B:
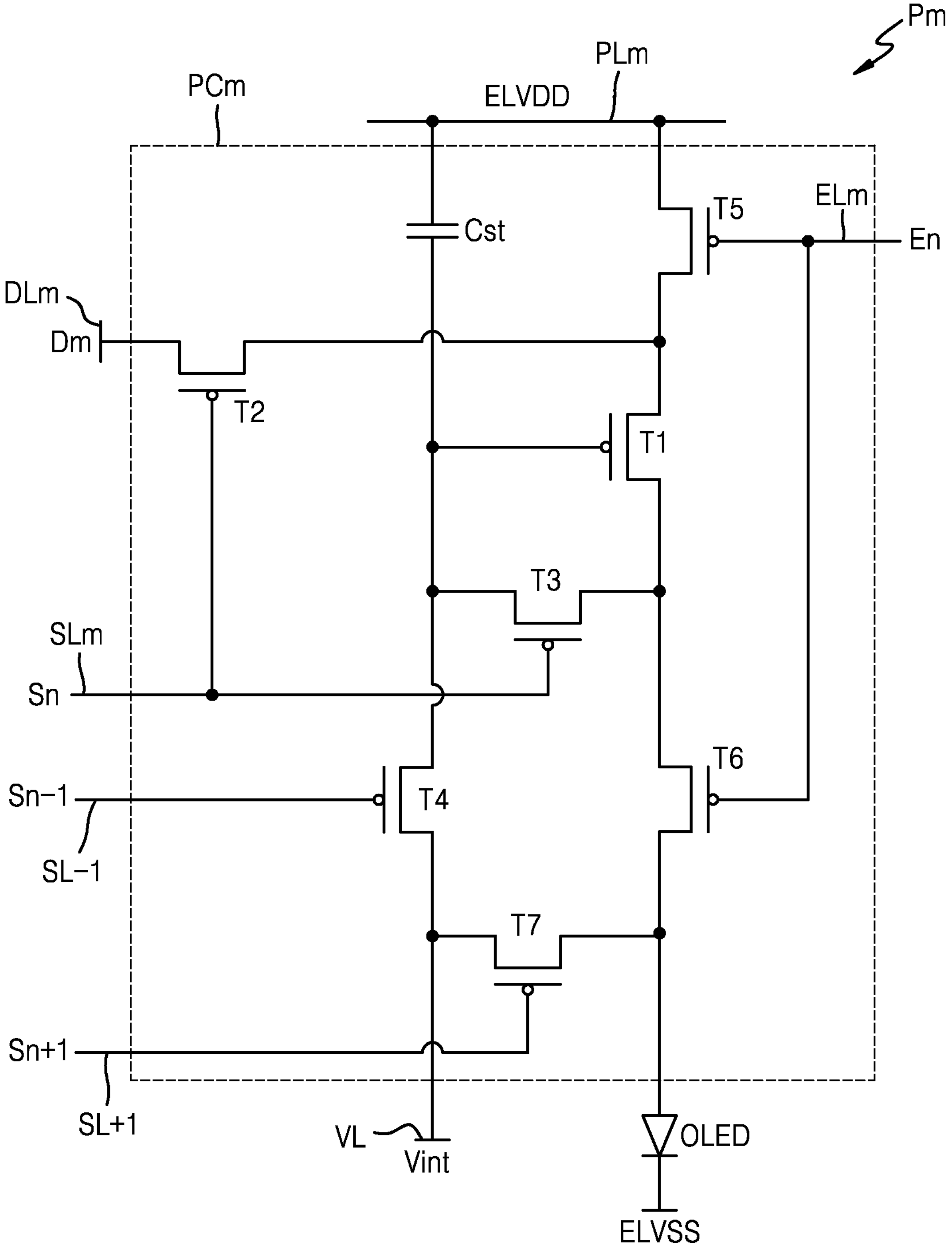

FIGS. 4A and 4B are equivalent circuit diagrams illustrating a pixel that may be included in a display panel according to an embodiment.

Referring to FIGS. 4A and 4B, the main sub-pixel Pm may include the main pixel circuit PCm and an organic light-emitting diode OLED that is a display element connected to the main pixel circuit PCm, and the auxiliary sub-pixel Pa includes the auxiliary pixel circuit PCa and an organic light-emitting diode OLED that is a display element connected to the auxiliary pixel circuit PCa. Although the auxiliary sub-pixel Pa includes a pixel circuit of FIG. 4A and the main sub-pixel Pm includes a pixel circuit of FIG. 4B, the disclosure is not limited thereto. In another embodiment, the main and auxiliary sub-pixels Pm and Pa may include at least one of the pixel circuits of FIGS. 4A and 4B. For example, both the main sub-pixel Pm and the auxiliary sub-pixel Pa may include the pixel circuit of FIG. 4B.

The auxiliary pixel circuit PCa of FIG. 4A may include a driving thin-film transistor T1, a switching thin-film transistor T2, and a storage capacitor Cst. The switching thin-film transistor T2 is connected to an auxiliary scan line SLa and an auxiliary data line DLa, and transmits a data signal Dm input through the auxiliary data line DLa to the driving thin-film transistor T1 according to a scan signal Sn input through the auxiliary scan line SLa.

The storage capacitor Cst is connected to the switching thin-film transistor T2 and an auxiliary driving voltage line PLa, and stores a voltage corresponding to a difference between a voltage received from the switching thin-film transistor T2 and a driving voltage ELVDD supplied to the auxiliary driving voltage line PLa.

The driving thin-film transistor T1 may be connected to the auxiliary driving voltage line PLa and the storage capacitor Cst, and may control driving current flowing through the organic light-emitting diode OLED from the auxiliary driving voltage line PLa in response to a value of the voltage stored in the storage capacitor Cst. The organic light-emitting diode OLED may emit light having a certain luminance due to the driving current $I_d$.

Although the auxiliary pixel circuit PCa includes two thin-film transistors and one storage capacitor in FIG. 4A, the disclosure is not limited thereto. In another embodiment, the auxiliary pixel circuit PCa may include seven thin-film transistors and one storage capacitor as described below with reference to FIG. 4B. In another embodiment, the auxiliary pixel circuits PCa may include two or more storage capacitors.

Referring to FIG. 4B, the main pixel circuit PCm may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Although each main pixel circuit PCm includes (main) signal lines (e.g., SLm, SL−1, SL+1, ELm, and DLm), a (main) initialization voltage line VL, and a (main) driving voltage line PLm in FIG. 4B, the disclosure is not limited thereto. In another embodiment, at least one of the (main) signal lines (e.g., SLm, SL−1, SL+1, ELm, and DLm), and/or the (main) initialization voltage line VL may be shared by neighboring pixel circuits.

A drain electrode of the driving thin-film transistor T1 may be electrically connected to the organic light-emitting diode OLED via the emission control thin-film transistor T6. The driving thin-film transistor T1 receives a data signal Dm and supplies driving current to the main organic light-emitting diode OLED according to a switching operation of the switching thin-film transistor T2.

A gate electrode of the switching thin-film transistor T2 is connected to a main scan line SLm, and a source electrode of the switching thin-film transistor T2 is connected to a main data line DLm. A drain electrode of the switching thin-film transistor T2 may be connected to a source electrode of the driving thin-film transistor T1 and may be connected to the main driving voltage line PLm via the operation control thin-film transistor T5.

The switching thin-film transistor T2 is turned on in response to a scan signal Sn received through the main scan line SLm and performs a switching operation of transmitting the data signal Dm through the main data line DLm to the source electrode of the driving thin-film transistor T1.

A gate electrode of the compensation thin-film transistor T3 may be connected to the main scan line SLm. A source electrode of the compensation thin-film transistor T3 may be connected to the drain electrode of the driving thin-film transistor T1, and may be connected to a pixel electrode of the organic light-emitting diode OLED via the emission control thin-film transistor T6. A drain electrode of the compensation thin-film transistor T3 may be connected to one electrode of the storage capacitor Cst, a source electrode of the first initialization thin-film transistor T4, and a gate electrode of the driving thin-film transistor T1. The compensation thin-film transistor T3 is turned on in response to the scan signal Sn received through the main scan line SLm and diode-connects the driving thin-film transistor T1 by connecting the gate electrode and the drain electrode of the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to one electrode of the storage capacitor Cst, the drain electrode of the compensation thin-film transistor T3, and the gate electrode of the driving thin-film transistor T1. The first initialization thin-film transistor T4 may be turned on in response to a previous scan signal Sn−1 received through the previous scan line SL−1, and may perform an initialization operation of initializing a voltage of the gate electrode of the driving thin-film transistor T1 by supplying an initialization voltage Vint to the gate electrode of the driving thin-film transistor T1.

A gate electrode of the operation control thin-film transistor T5 may be connected to an emission control line ELm. A source electrode of the operation control thin-film transistor T5 may be connected to the main driving voltage line PLm. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line ELm. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 may be simultaneously turned on in response to an emission control signal En received through the emission control line ELm, and thus a driving voltage ELVDD is supplied to the organic light-emitting diode OLED and driving current flows through the organic light-emitting diode OLED.

A gate electrode of the second initialization thin-film transistor T7 may be connected to a next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on in response to a next scan signal Sn+1 received through the next scan line SL+1 to initialize the pixel electrode of an organic light-emitting diode OLED.

Although the first initialization thin-film transistor T4 and the second initialization thin-film transistor T7 are respectively connected to the previous scan line SL−1 and the next scan line SL+1 in FIG. 4B, the disclosure is not limited thereto. In another embodiment, both the first initialization thin-film transistor T4 and the second initialization thin-film transistor T7 may be connected to the previous scan line SL−1 and may be driven according to the previous scan signal Sn−1.

Another electrode of the storage capacitor Cst may be connected to the main driving voltage line PLm. Any one electrode of the storage capacitor Cst may be connected to the gate electrode of the driving thin-film transistor T1, the drain electrode of the compensation thin-film transistor T3, and the source electrode of the first initialization thin-film transistor T4.

A counter electrode (e.g., cathode) of the organic light-emitting diode OLED receives a common voltage ELVSS. The organic light-emitting diode OLED may receive driving current from the driving thin-film transistor T1 and may emit light.

In the main and auxiliary pixel circuits PCm and PCa according to an embodiment, the number of thin-film transistors and storage capacitors and a circuit design are not limited to those described with reference to FIGS. 4A and 4B, and the number and circuit design may be changed in various ways.

Figure 5A:
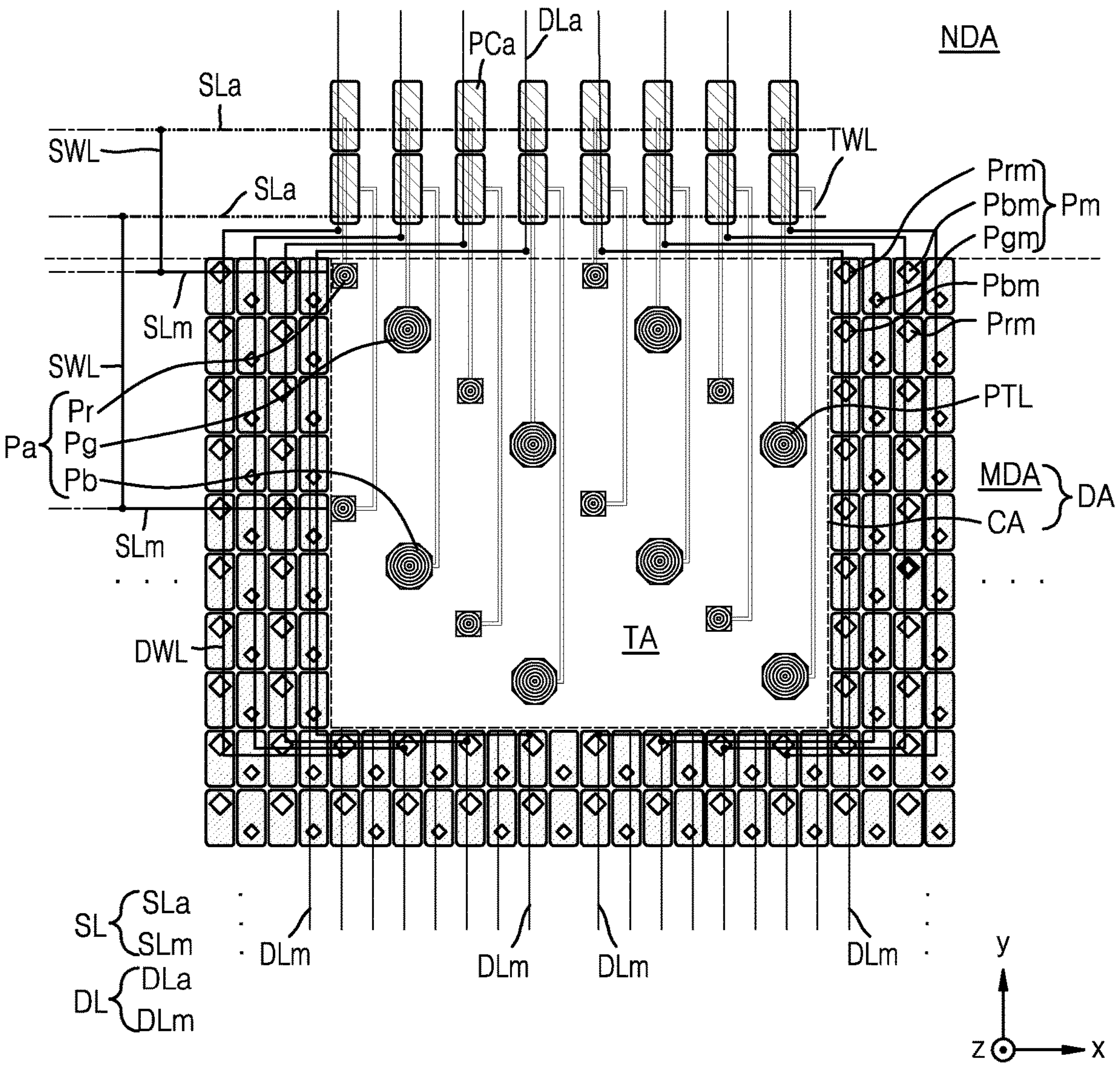
FIGS. 5A and 5B are plan views illustrating an arrangement of a portion of a display panel, according to embodiments.
Figure 5B:
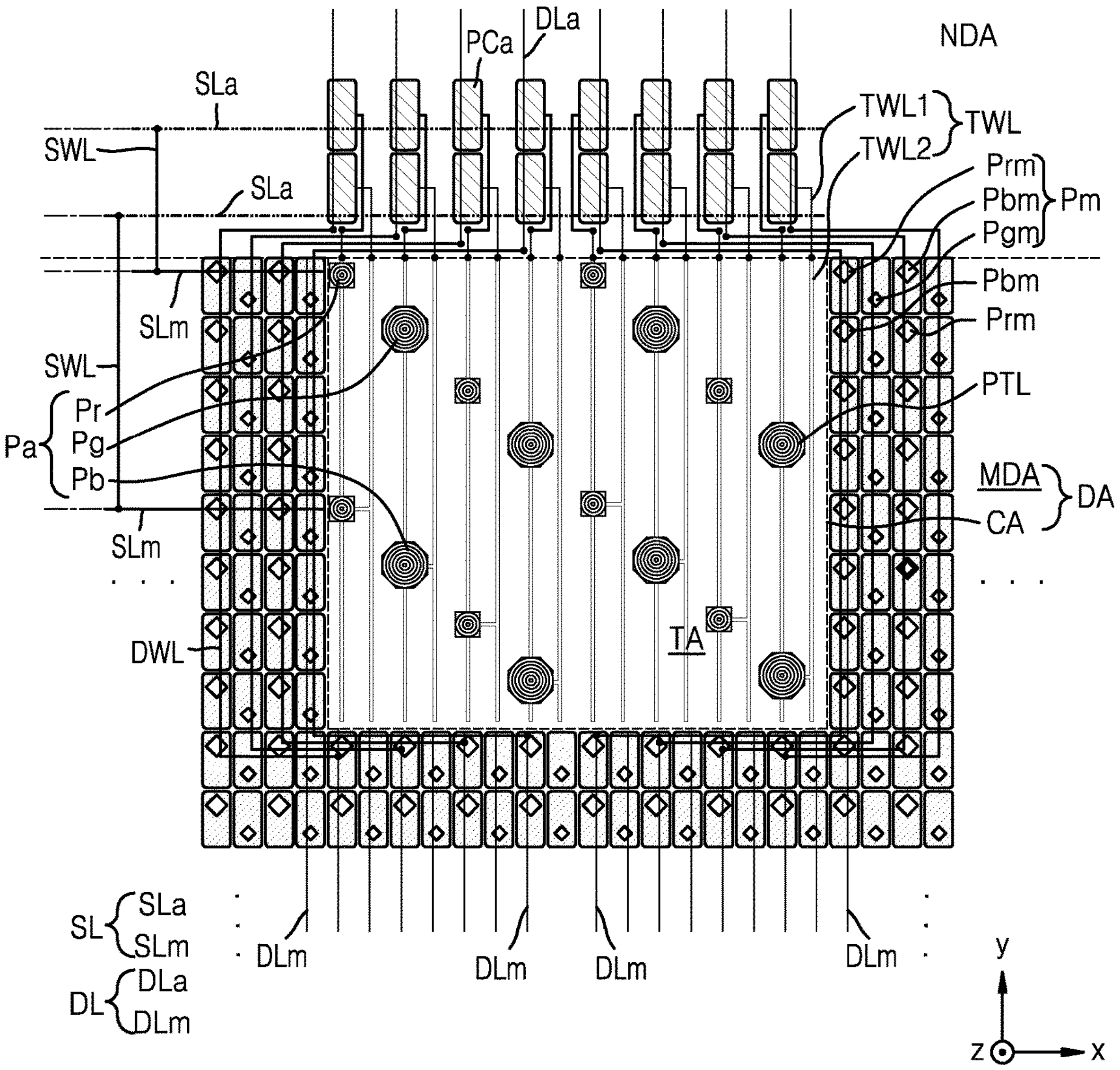

FIGS. 5A and 5B are plan views illustrating an arrangement of a portion of a display panel according to embodiments. In detail, FIGS. 5A and 5B illustrate the component area CA, and parts of the main display area MDA and the peripheral area NDA adjacent to the component area CA.

Referring to FIG. 5A, the plurality of main sub-pixels Pm may be located in the main display area MDA. The term 'sub-pixel' used herein which is a minimum unit for forming an image refers to an emission area where light is emitted by a display element. When an organic light-emitting diode is used as a display element, the emission area may be defined by an opening of a pixel-defining film, which will be described below. Each of the plurality of main sub-pixels Pm may emit any one of red light, green light, blue light, and white light.

In an embodiment, the main sub-pixels Pm located in the main display area MDA may include a first sub-pixel Prm, a second sub-pixel Pgm, and a third sub-pixel Pbm. The first sub-pixel Prm, the second sub-pixel Pgm, and the third sub-pixel Pbm may respectively represent red, green, and blue colors.

For example, the first sub-pixels Prm may be located at first and third vertices facing each other from among vertices of a virtual quadrangle with a central point of the second sub-pixel Pgm as a central point of the virtual quadrangle, and the third sub-pixels Pbm may be located at second and fourth vertices that are the remaining vertices. In an embodiment, a size of the second sub-pixel Pgm (i.e., an emission size) may be less than a size (e.g., an emission size) of each of the first sub-pixel Prm and the third sub-pixel Pbm.

Such a pixel arrangement structure may be referred to as a pentile (PENTILE™) matrix structure or a pentile structure, and a rendering driving method that represents a color by sharing adjacent pixels may be used, thereby displaying an image having a high resolution with a small number of pixels.

Although the plurality of main sub-pixels Pm are arranged in a pentile (PENTILE™) matrix structure in FIG. 5A, the disclosure is not limited thereto. For example, the plurality of main sub-pixels Pm may be arranged in any of various structures such as a stripe structure, a mosaic arrangement structure, or a delta arrangement structure.

In the main display area MDA, the main pixel circuits PCm may overlap the main sub-pixels Pm, and the main pixel circuits PCm may be arranged in a matrix shape in the x direction and the y direction. The main pixel circuit PCm used herein refers to a unit of a pixel circuit for implementing one main sub-pixel Pm.

The plurality of auxiliary sub-pixels Pa may be located in the component area CA. Each of the plurality of auxiliary sub-pixels Pa may emit any of red light, green light, blue light, and white light. The auxiliary sub-pixels Pa may include a first sub-pixel Pr, a second sub-pixel Pg, and a third sub-pixel Pb that emit light of different colors. The first sub-pixel Pr, the second sub-pixel Pg, and the third sub-pixel Pb may respectively represent red, green, and blue colors.

The number of the auxiliary sub-pixels Pa located per unit area in the component area CA may be less than the number of the main sub-pixels Pm located per unit area in the main display area MDA. A ratio between the number of the auxiliary sub-pixels Pa and the number of the main sub-pixels Pm located per unit area may be 1:2, 1:4, 1:8, or 1:9. That is, a ratio between a resolution of the component area CA and a resolution of the main display area MDA may be ½, ¼, ⅛, or ⅑. In FIG. 5A, a ratio between a resolution of the component area CA and a resolution of the main display area MDA is 1:8.

The auxiliary sub-pixels Pa located in the component area CA may be arranged in any of various structures. Some of the auxiliary sub-pixels Pa may form a pixel group, and may be arranged in any of various structures such as a pentile structure, a stripe structure, a mosaic arrangement structure, or a delta arrangement structure within the pixel group. In this case, a distance between the auxiliary sub-pixels Pa located in the pixel group may be the same as a distance between the main sub-pixels Pm.

Alternatively, as shown in FIG. 5A, the auxiliary sub-pixels Pa may be distributed in the component area CA. That is, a distance between the auxiliary sub-pixels Pa may be greater than a distance between the main sub-pixels Pm. A portion of the component area CA where the auxiliary sub-pixels Pa are not located may be the transmissive area TA having a high light transmittance.

The auxiliary pixel circuits PCa for controlling light emission of the auxiliary sub-pixels Pa may be located in the peripheral area NDA. Because the auxiliary pixel circuits PCa are not located in the component area CA, the component area CA may secure a wider transmissive area TA.

The auxiliary pixel circuits PCa may be respectively connected to the auxiliary sub-pixels Pa through the connection wirings TWL. Accordingly, when a length of the connection wiring TWL increases, RC delay may occur. Accordingly, the auxiliary pixel circuits PCa may be arranged in consideration of lengths of the connection wirings TWL.

In an embodiment, the auxiliary pixel circuits PCa may be located on an extension line that connects the auxiliary sub-pixels Pa arranged in the y direction. Also, as many auxiliary pixel circuits PCa as the auxiliary sub-pixels Pa arranged in the y direction may be arranged in the y direction. For example, when two auxiliary sub-pixels Pa are arranged in the y direction in the component area CA as shown in FIG. 5A, two auxiliary pixel circuits PCa may be arranged in the y direction in the peripheral area NDA.

The connection wirings TWL may extend in the y direction, to respectively connect the auxiliary sub-pixels Pa to the auxiliary pixel circuits PCa. When the connection wiring TWL is connected to the auxiliary sub-pixel Pa, it may mean that the connection wiring TWL is electrically connected to a pixel electrode of a display element for implementing the auxiliary sub-pixel Pa.

The scan line SL may include the main scan line SLm connected to the main pixel circuits PCm, and the auxiliary scan line SLa connected to the auxiliary pixel circuits PCa. The main scan line SLm may extend in the x direction and may be connected to the main pixel circuits PCm located in the same row. The main scan line SLm may not be located in the component area CA. That is, the main scan line SLm may be disconnected in the component area CA. In this case, the main scan line SLm located on the left of the component area CA may receive a signal from the first scan driving circuit SDR1 (see FIG. 3), and the main scan line SLm located on the right of the component area CA may receive a signal from the second scan driving circuit SDR2 (see FIG. 3).

The auxiliary scan line SLa may extend in the x-direction and may be connected to the auxiliary pixel circuits PCa located in the same row. The auxiliary scan line SLa may be located in the peripheral area NDA.

The main scan line SLm and the auxiliary scan line SLa may be connected to each other by a scan connection line SWL, and the same signal may be applied to pixel circuits for driving the main sub-pixel Pm and the auxiliary sub-pixel Pa located in the same row. The scan connection line SWL may be located on a different layer from the main scan line SLm and the auxiliary scan line SLa, and the scan connection line SWL may be connected to the main scan line SLm and the auxiliary scan line SLa through contact holes. The scan connection line SWL may be located in the peripheral area NDA.

The data line DL may include the main data line DLm connected to the main pixel circuits PCm and the auxiliary data line DLa connected to the auxiliary pixel circuits PCa. The main data line DLm may extend in the y-direction, and may be connected to the main pixel circuits PCm located in the same column. The auxiliary data line DLa may extend in the y direction, and may be connected to the auxiliary pixel circuits PCa located in the same column.

The main data line DLm and the auxiliary data line DLa may be spaced apart from each other with the component area CA disposed therebetween. The main data line DLm and the auxiliary data line DLa may be connected to each other by a data connection line DWL and the same signal may be applied to pixel circuits for driving the main sub-pixel Pm and the auxiliary sub-pixel Pa located in the same column.

The data connection line DWL may be located to bypass the component area CA. In an embodiment, the data connection line DWL may overlap the main pixel circuits PCm located in the main display area MDA. As the data connection line DWL is located in the main display area MDA, a separate space in which the data connection line DWL is located does not need to be secured, thereby minimizing a size of a dead space.

In another embodiment, the data connection line DWL may be located in an intermediate area (not shown) between the main display area MDA and the component area CA.

The data connection line DWL may be located on a different layer from the main data line DLm and the auxiliary data line DLa, and the data connection line DWL may be connected to the main data line DLm and the auxiliary data line DLa through contact holes.

Although the connection wiring TWL is integrally formed from the peripheral area NDA to the auxiliary sub-pixels Pa of the component area CA in FIG. 5A, the disclosure is not limited thereto.

The connection wiring TWL may include a first connection wiring TWL1 and a second connection wiring TWL2 formed of different materials as shown in FIG. 5B.

The first connection wiring TWL1 may be located in the peripheral area NDA and may be connected to the auxiliary pixel circuit PCa. The first connection wiring TWL1 may include a conductive material including molybdenum (Mo), aluminum (Al), copper (Cu), or titanium (Ti), and may have a single or multi-layer structure including the above material. A plurality of first connection wirings TWL1 may be provided between the auxiliary pixel circuits PCa. In an embodiment, the first connection wirings TWL1 may include a 1-1$^{th}$ connection wiring and a 1-2$^{th}$ connection wiring located on different layers.

The second connection wiring TWL2 may be located in the component area CA, and may be connected to the first connection wiring TWL1 at an edge of the component area CA. The second connection wiring TWL2 may include a transparent conductive material.

The first connection wiring TWL1 and the second connection wiring TWL2 may be located on the same layer, or may be located on different layers. When the first connection wiring TWL1 and the second connection wiring TWL2 are located on different layers, the first connection wiring TWL1 and the second connection wiring TWL2 may be connected to each other through a contact hole.

The first connection wiring TWL1 may have a higher conductivity than the second connection wiring TWL2. Because the first connection wiring TWL1 is located in the peripheral area NDA and thus does not need to ensure a light transmittance, the first connection wiring TWL1 may include a material having a lower light transmittance but a higher conductivity than the second connection wiring TWL2. Accordingly, a resistance value of the connection wiring TWL may be reduced.

As shown in FIG. 5B, lengths of the plurality of second connection wirings TWL2 may be the same. For example, ends of the plurality of second connection wirings TWL2 may extend to the opposite boundary of the component area CA where the auxiliary pixel circuits PCa are located. This may be for matching electrical loads due to the second connection wirings TWL2. Accordingly, luminance deviation in the component area CA may be minimized. The number of the second connection wirings TWL2 of the component area CA may be the same as the number of the auxiliary pixel circuits PCa.

In the present embodiment, a pattern layer PTL may overlap the auxiliary sub-pixel Pa located in the component area CA. When the pattern layer PTL overlaps the auxiliary sub-pixel Pa, it may mean that the pattern layer PTL overlaps the auxiliary display device EDa in a plan view. In more detail, it may mean that the pattern layer PTL overlaps an auxiliary pixel electrode of the auxiliary light-emitting device EDa in a plan view. However, in this case, a width of the pattern layer PTL may not be greater than a width of the auxiliary light-emitting device EDa, specifically, a width of the auxiliary pixel electrode of the auxiliary light-emitting device EDa, and may be less than or equal to a width of the auxiliary pixel electrode of the auxiliary light-emitting device EDa.

In an embodiment, the pattern layer PTL may include a plurality of patterns having a same center and different diameters. That is, the plurality of patterns may have a concentric shape. Moreover, the plurality of patterns in the pattern layer PTL and the auxiliary light-emitting device Eda in the same pixel may also have the same center. For example, the center of the plurality of patterns in the pattern layer PTL and the auxiliary pixel electrode of the auxiliary light-emitting device Eda in the same pixel may have the same center.

The pattern layer PTL may include a metal material. For example, a reflective metal film including silver (Ag), magnesium (Mg), aluminum (Al), platinum (Pt), palladium (Pd), gold (Au), nickel (Ni), neodymium (Nd), iridium (Ir), chromium (Cr), molybdenum (Mo), or a compound thereof. In another embodiment, the pattern layer PTL may include an inorganic insulating material, for example, an inorganic insulating film including silicon oxide ($SiO_2$), silicon nitride ($SiN_x$), silicon oxynitride ($SiO_xN_y$), or a compound thereof. For example, when the pattern layer PTL includes a metal material, the pattern layer PTL may include, for example, molybdenum (Mo) and may have a thickness ranging from about 2000 Å to about 3000 Å, for example, about 2500 Å. When the pattern layer PTL includes an inorganic insulating material, the pattern layer PTL may include silicon nitride ($SiN_x$) and may have a thickness ranging from about 5000 Å to about 7000 Å, for example, 6000 Å.

The pattern layer PTL will be described in detail with reference to FIG. 6.

As described above, the auxiliary sub-pixels Pa may include the first sub-pixel Pr, the second sub-pixel Pg, and the third sub-pixel Pb emitting light of different colors, and the first sub-pixel Pr, the second sub-pixel Pg, and the third sub-pixel Pb may have different sizes. Because the pattern layer PTL overlaps each of the first sub-pixel Pr, the second sub-pixel Pg, and the third sub-pixel Pb, a size (area) of the pattern layer PTL in each of the first sub-pixel Pr, the second sub-pixel Pg, and the third sub-pixel Pb may be different from each other. However, even in this case, a width of the pattern layer PTL may not be greater than a width of the auxiliary pixel electrode of the auxiliary light-emitting device EDa.

The component area CA includes the transmissive area TA as described above, and thus, an image may be formed and captured due to light incident on the component 40 through the transmissive area TA.

In a comparative example, part of light passing through the transmissive area TA may be reflected, refracted, and diffracted by the component 40, for example, a camera lens, and may re-enter the camera lens. The reflected light may be incident on the component 40. Because the reflected light has some noise, the component 40 may have distorted information. For example, when the component 40 is a camera including an image sensor, an image captured by the camera may be different from an actual image. As such, as the reflected light re-enters the camera lens, ghosting in which an unintended double image different from an actual image is formed may occur.

Accordingly, in the electronic device 1 according to an embodiment, the pattern layer PTL overlaps the auxiliary sub-pixel Pa located in the component area CA. Accordingly, because light passing through the transmissive area TA and reflected, refracted, and reflected by the component is scattered by the pattern layer PTL, the reflected light may be prevented or minimized from re-entering into the component, thereby improving the reliability of information output from the component 40.

Figure 6A:
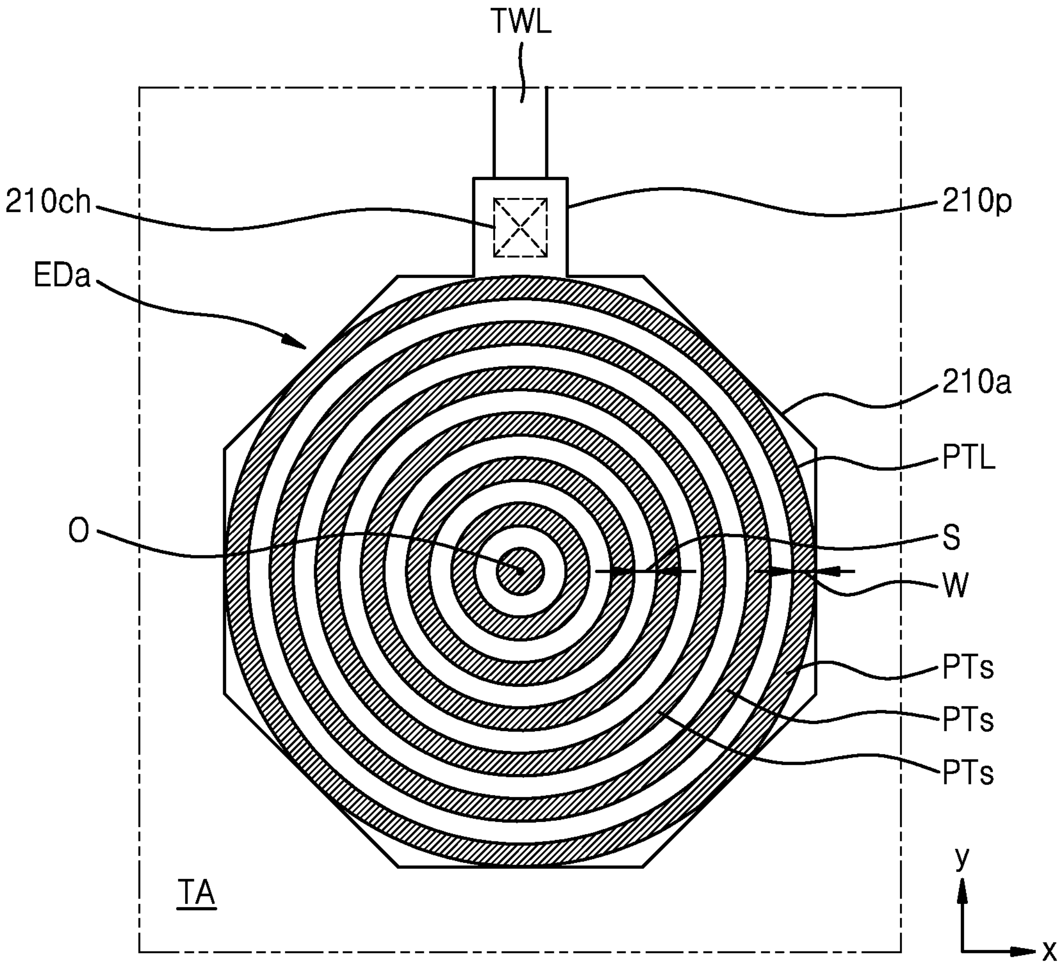
FIGS. 6A, 6B and 6C are plan views illustrating a shape of a pattern layer.
Figure 6B:
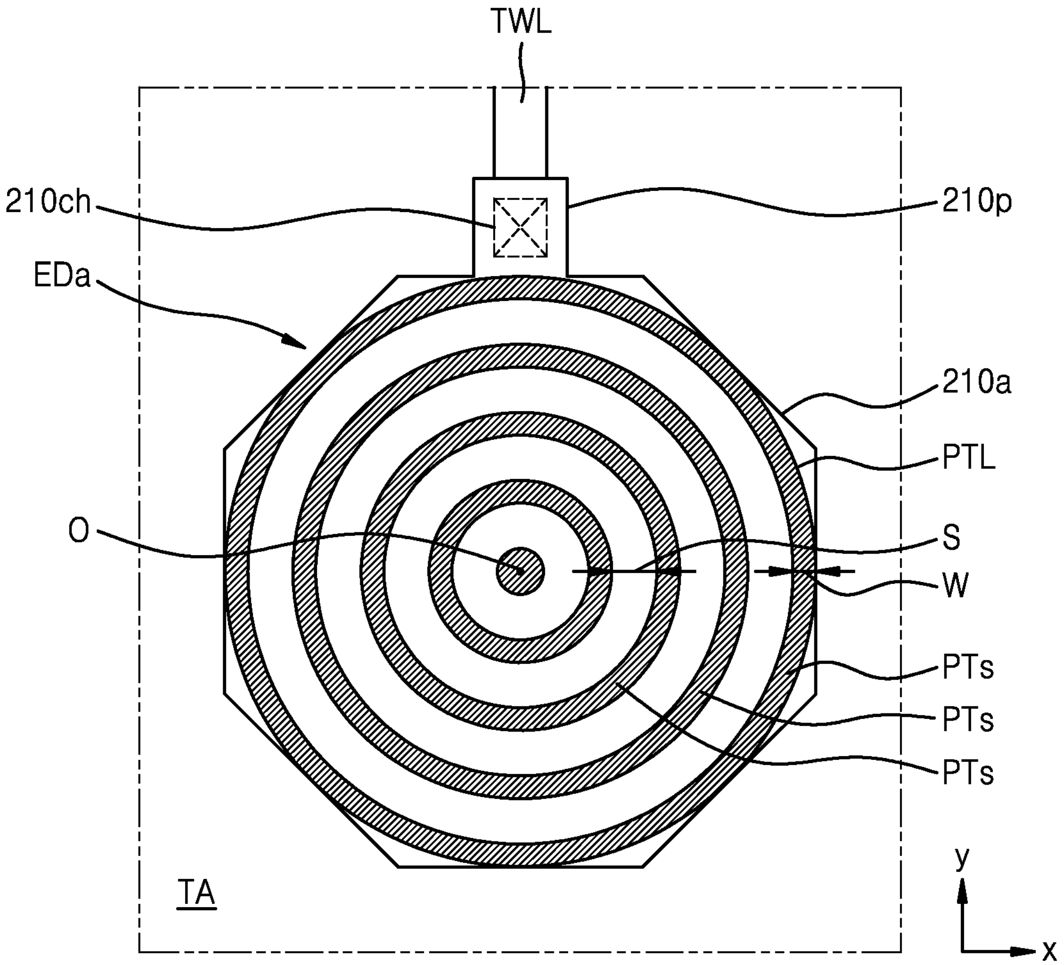
Figure 6C:
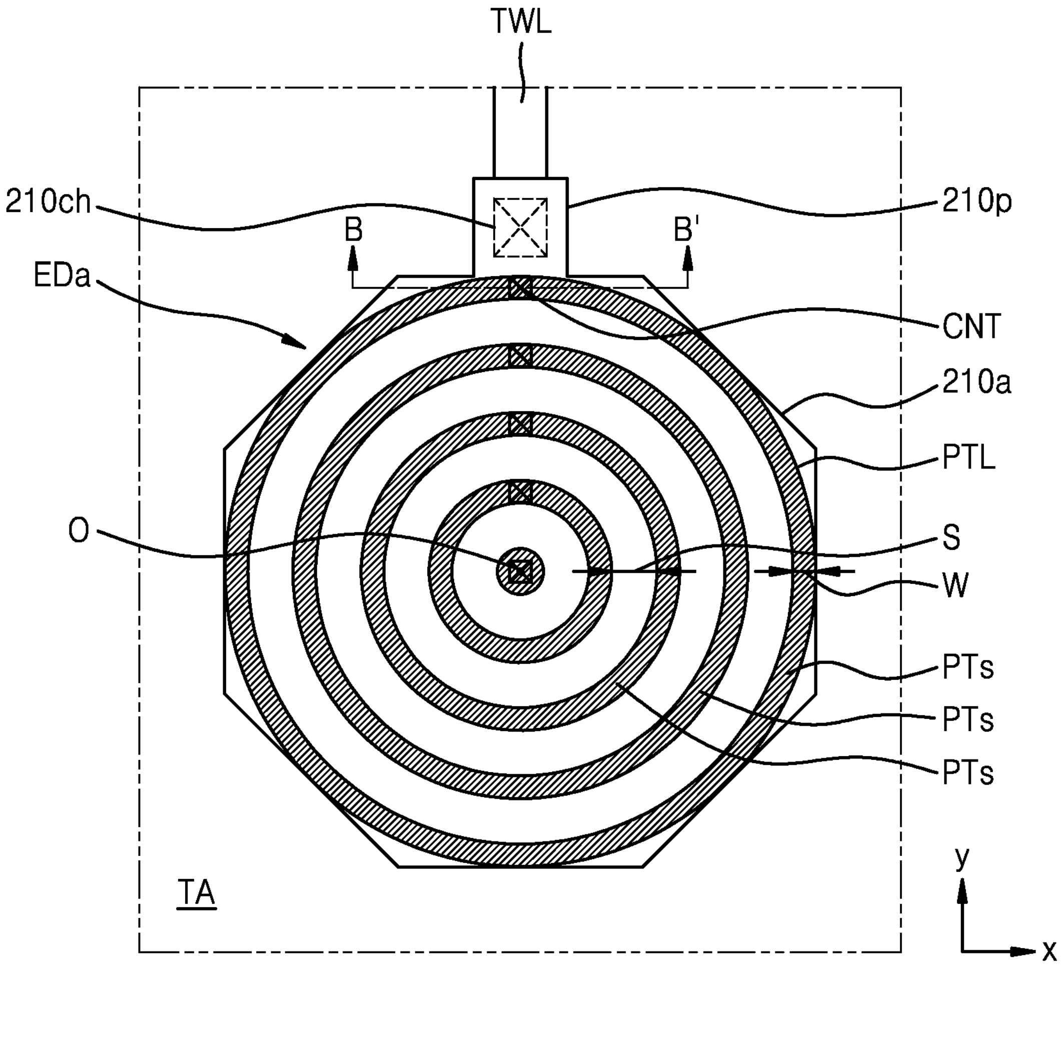
Figure 7:
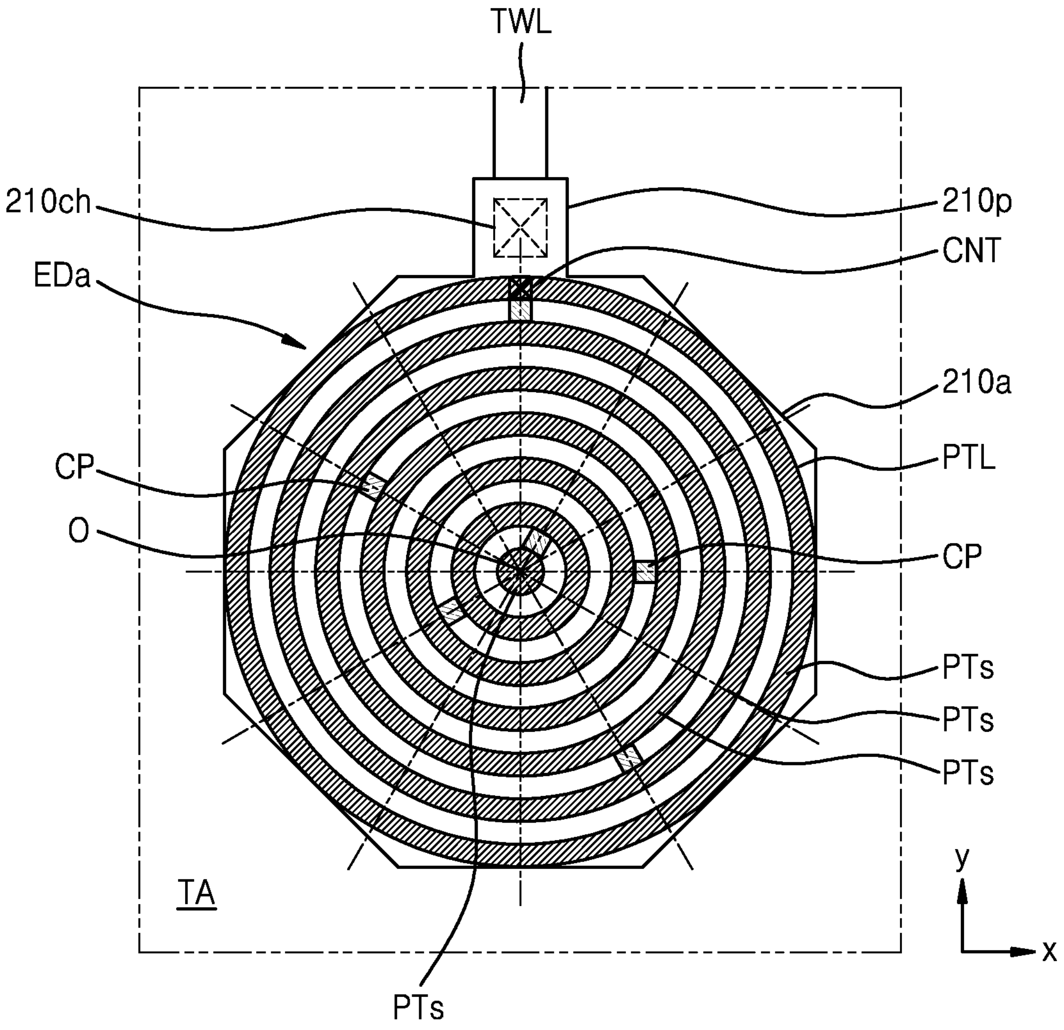
FIG. 7 is a view illustrating a pattern layer, according to another embodiment.

FIGS. 6A through 6C are plan views illustrating a shape of a pattern layer, according to an embodiment. FIG. 7 is a view illustrating a pattern layer according to another embodiment.

Referring to FIG. 6A, a side of an auxiliary pixel electrode 210*a* of the auxiliary light-emitting device EDa may be connected to the connection wiring TWL through a contact hole 210*ch*. Although the auxiliary pixel electrode 210*a* has a substantially octagonal shape in FIG. 6A, a shape of the auxiliary pixel electrode 210*a* may be any of various shapes such as a polygonal shape, a circular shape, or an elliptical shape. The contact hole 210*ch* may be formed in a protrusion 210*p* protruding from the side of the auxiliary pixel electrode 210*a* to secure a maximum emission area of the auxiliary light-emitting device EDa and minimize the transmissive area TA shielded by the auxiliary pixel electrode 210*a*.

In an embodiment, the area of the pattern layer PTL may be less than or equal to that of the auxiliary pixel electrode 210*a*. That is, the pattern layer PTL may be completely overlapped with the auxiliary pixel electrode 210 and may not be located beyond the auxiliary pixel electrode 210*a* in a plan view. A width of the pattern layer PTL in one direction may not be greater than a width of the auxiliary light-emitting device EDa, specifically, a width of the auxiliary pixel electrode 210*a* of the auxiliary light-emitting device EDa, and may be less than or equal to a width of the auxiliary pixel electrode 210*a* of the auxiliary light-emitting device EDa.

In a plan view, the pattern layer PTL may include a plurality of patterns PTs having a concentric shape. The plurality of patterns PTs may have the same center O and may have different diameters. The number of the plurality of patterns PTs of the pattern layer PTL is not limited and may vary according to the area of the auxiliary pixel electrode 210*a* and a first line width W of each of the plurality of patterns PTs and a first separation distance S of the plurality of patterns PTs. The auxiliary pixel electrode 210*a* of the auxiliary light-emitting device Eda and the plurality of patterns PTs of the pattern layer PTL may have the same center O.

In an embodiment, each of the plurality of patterns PTs may be floated (or isolated). That is, the plurality of patterns PTs may be spaced apart from one another and may not be electrically connected to one another. However, to prevent a damage due to static electricity or the like caused by the pattern layer PTL, the pattern layer PTL may be applied with a certain voltage.

In an embodiment, the plurality of patterns PTs may have the first line width W and the first separation distance S. In this case, the first separation distance S of the plurality of patterns PTs may be greater than or equal to the first line width W. In FIG. 6A, the first separation distance S and the first line width W of the plurality of patterns PTs are the same. For example, the first line width W of the plurality of patterns PTs may be greater than or equal to 1.2 μm and less than equal to 3.0 μm. It is not easy in a process for the first line width W of the plurality of patterns PTs to be less than 1.2 μm, and when the first line width W exceeds 3.0 μm, scattering and diffraction of reflected light by the plurality of patterns PTs may be reduced.

In FIG. 6B, the first separation distance S of the plurality of patterns PTs is greater than the first line width W. In this case, the first separation distance S of the plurality of patterns PTs may be less than or equal to twice the first line width W. In other words, a ratio between the first line width W and the first separation distance S of the plurality of patterns PTs may range from 1:1 to 1:2. The first separation distance S of the plurality of patterns PTs may be up to twice the first line width W, and when the first separation distance S of the plurality of patterns PTs exceeds twice the first line width W, sufficient scattering and diffraction of reflected light may not occur. For example, the first line width W of the plurality of patterns PTs may be greater than or equal to 1.2 μm and less than or equal to 3.0 μm, and in this case, the first separation distance S of the plurality of patterns PTs may be greater than or equal to 2.4 μm and less than or equal to 6.0 μm.

Figure 6D:
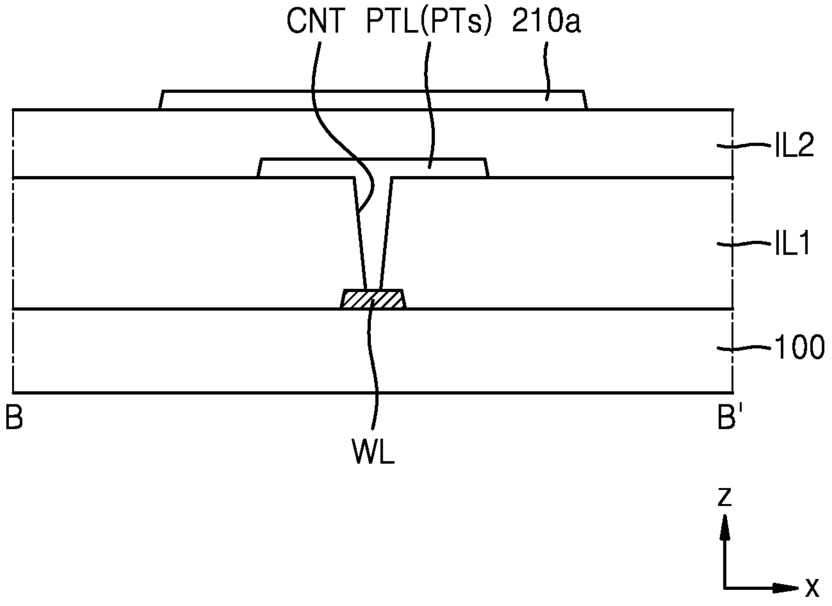
FIG. 6D is a cross-section view taken along line B-B' in FIG. 6C according to an embodiment.

In an embodiment, the pattern layer PTL may be electrically connected to a wiring or an electrode. For example, a constant voltage may be applied to the pattern layer PTL. As shown in FIGS. 6C and 6D, each of the plurality of patterns PTs of the pattern layer PTL may be electrically connected to a wiring or an electrode WL to which a constant voltage is applied. In FIG. 6D, which corresponds to a cross-section taken along line B-B' in FIG. 6C, the wiring or electrode WL is shown disposed on the substrate 100 for convenience of explanation, but the wiring or electrode WL, of course, an insulating layer may be further interposed between the substrate 100 and the wiring or electrode WL. In addition, a first insulating layer IL1 is interposed between the wiring or electrode WL and the pattern layer PTL, and a second insulating layer IL2 is interposed between the pattern layer PTL and the pixel electrode 210*a*. Although illustrated, the present invention is not necessarily limited thereto. In addition, although the wiring or electrode WL is illustrated to be positioned under the pattern layer PTL, as another example, the wiring or electrode WL is disposed above the pattern layer PTL, that is, the pattern layer PTL and the pixel electrode 210*a*, or on the same layer as the wiring or electrode WL.

In this case, because the plurality of patterns PTs are spaced apart from one another, in order to apply a constant voltage to all of the plurality of patterns PTs, each of the plurality of patterns PTs should have a contact portion CNT connected to a wiring or an electrode. As a connection electrode for applying a voltage to the pattern layer PTL, the pixel electrode 210*a* that is aligned with the pattern layer PTL may be used. However, the disclosure is not limited thereto, and the pattern layer PTL may be connected to a wiring that provides a common voltage ELVSS or an initialization voltage Vint.

Referring to FIG. 7, in order to simplify a structure for applying a constant voltage to the pattern layer PTL, a connection pattern CP may be located between adjacent patterns PTs to electrically connect of the adjacent patterns PTs. That is, as the plurality of patterns PTs are connected to one another through a plurality of connection patterns CP, at least one contact portion CNT for applying a constant voltage may be provided.

The connection pattern CP may be located between adjacent patterns PTs. The connection pattern CP and the plurality of patterns PTs may be formed of the same material and may be located on the same layer. Positions of the connection patterns CP are not limited, but preferably, the connection patterns CP may be randomly arranged. When the connection patterns CP are randomly arranged, it may mean that the plurality of connection patterns CP are arranged without regularity, and the plurality of connection patterns CP are not arranged on the same line. As such, as the plurality of connection patterns CP are randomly arranged, scattering and diffraction of reflected light by the pattern layer PTL may be maximized.

Various embodiments of a cross-section of the pattern layer PTL of 6A or the like are illustrated in FIGS. 21 through 25. FIGS. 21 through 25 may correspond to a cross-section taken along line A-A' of FIG. 6A. However, a cross-sectional structure of the pattern layer PTL is not limited thereto and may be applied to FIGS. 6A through 6C and FIG. 7. Also, for convenience of explanation, FIGS. 21 and 25 mainly illustrate first through seventh insulating layers IL1 through IL7 and the pattern layer PTL, and an element such as the pixel electrode 210 over the pattern layer PTL is not shown. Also, the first through seventh insulating layers IL1 through IL7 of FIGS. 21 through 25 may correspond to a layer structure of a cross-sectional view of FIG. 8 or the like, or a new layer inserted into a layer structure of FIG. 8 or the like.

Figure 21:
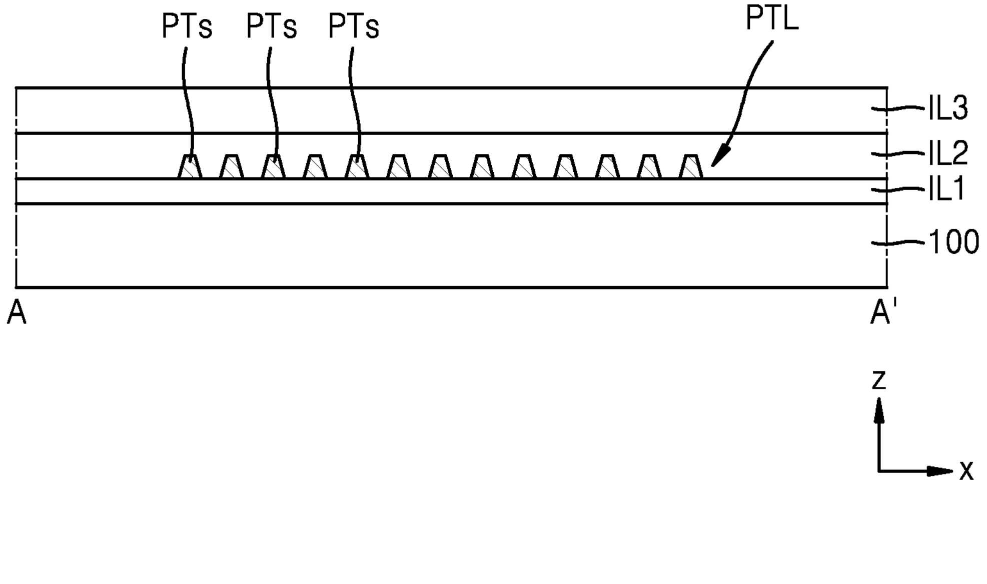

Referring to FIG. 21, the plurality of patterns PTs having a concentric shape included in the pattern layer PTL may be located on the same layer. For example, in FIG. 21, the plurality of patterns PTs are located on the first insulating layer IL1.

Figure 22:
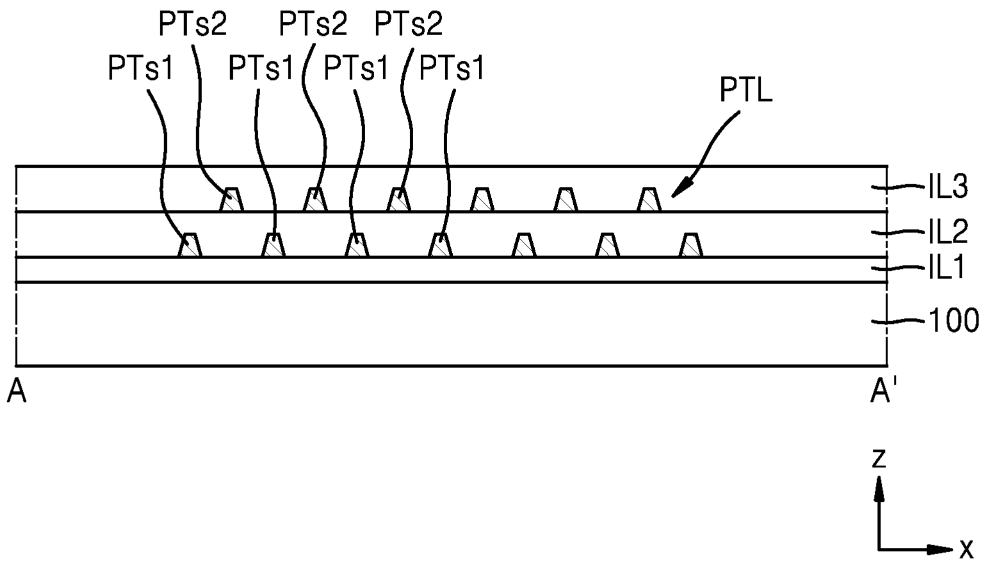

In another embodiment, as shown in FIG. 22, the plurality of patterns PTs having a concentric shape included in the pattern layer PTL may be alternately located on different layers. That is, when n patterns PTs are arranged based on a central (or outermost) pattern from among the plurality of patterns PTs, odd numbered patterns (n=1, 3, 5, 7 . . . ) and even numbered patterns (n=2, 4, 6 . . . ) may be located on different layers. For example, in FIG. 22, a plurality of first patterns PTs1 may be located on the first insulating layer IL1 and a plurality of second patterns PTs2 may be located on the second insulating layer IL2.

Figure 23:
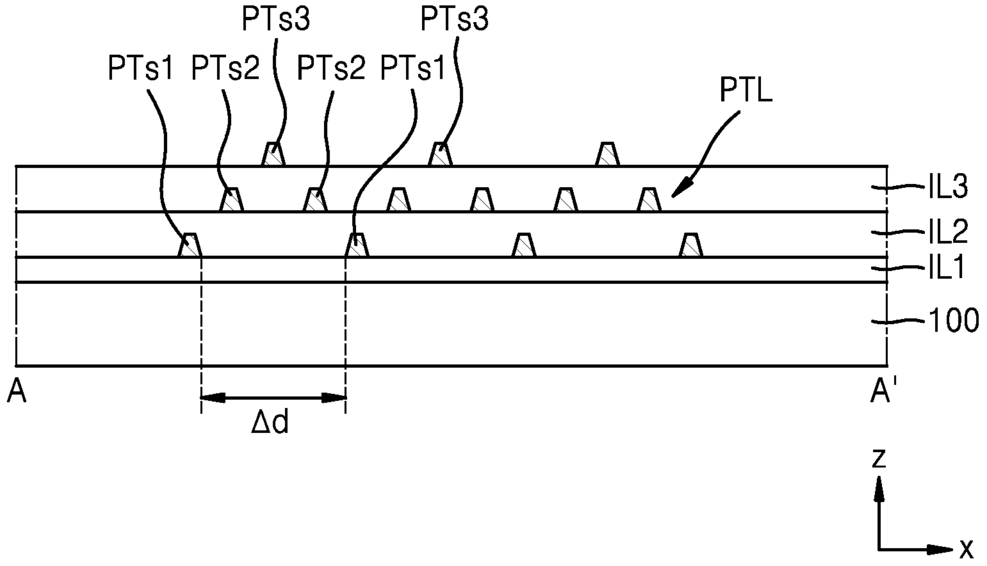

Although the plurality of patterns PTs are alternately located on two layers in FIG. 22, in another embodiment, as shown in FIG. 23, the plurality of patterns PTs having a concentric shape included in the pattern layer PTL may be sequentially alternately located on three layers. For example, in FIG. 23, a pattern located at the center of a concentric circle from among the plurality of patterns PTs is located on the third insulating layer IL3, and patterns adjacent to the pattern are sequentially located on the second insulating layer IL2 and the first insulating layer IL1. As such, because some of the plurality of patterns PTs are located on different layers, an interval (Δd) between the plurality of patterns PTs located on the same layer may be increased and thus electrical interference or parasitic capacitance between the plurality of patterns PTs may be reduced.

Figure 24:
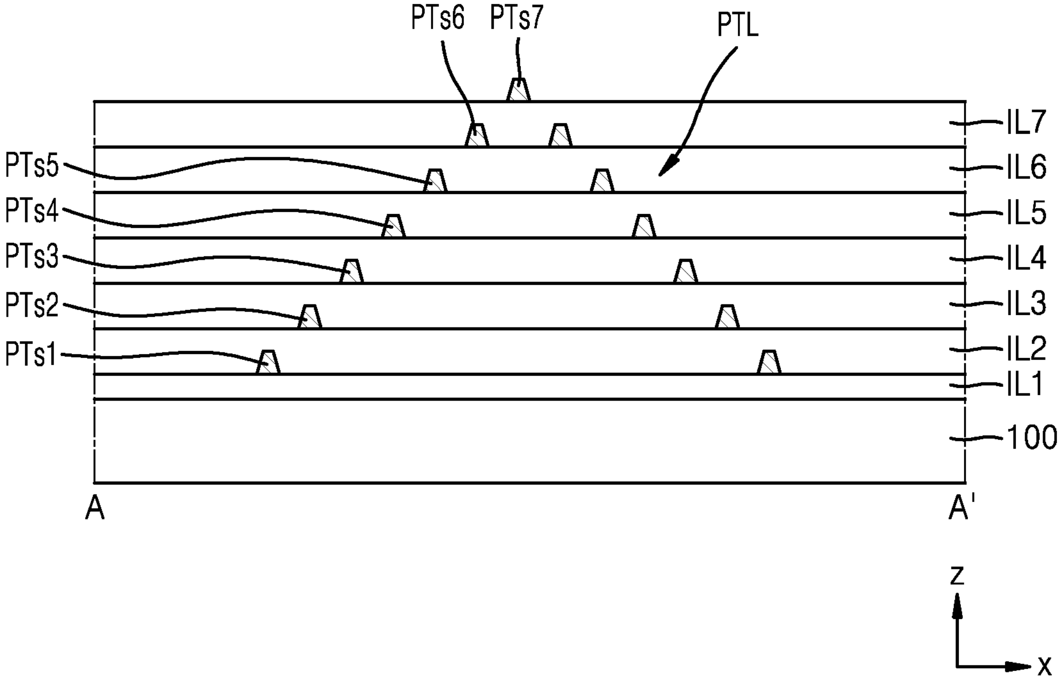
Figure 25:
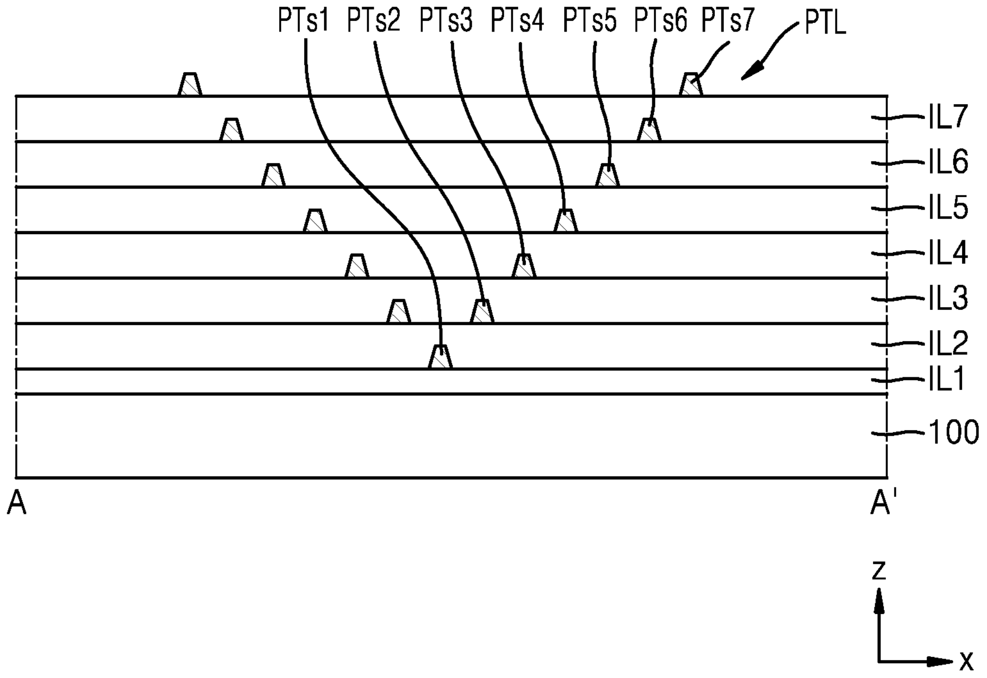

In another embodiment, as shown in FIGS. 24 and 25, all of the plurality of patterns PTs having a concentric shape included in the pattern layer PTL may be located on different layers. Referring to FIG. 24, a first pattern PTs1 that is an outermost pattern from among the plurality of patterns PTs having a concentric shape may be located on the first insulating layer IL1, and a second pattern PTs2 through a seventh pattern PTs7 sequentially formed inside the first pattern PTs1 may be sequentially located on the second through seventh insulating layers IL2 through IL7. In a cross-sectional view, the plurality of patterns PTs of FIG. 24 may have a substantially pyramid shape.

Alternatively, as shown in FIG. 25, the plurality of patterns PTs may have an inverted shape of a structure of FIG. 24. In this case, a seventh pattern PTs7 that is an outermost pattern from among the plurality of patterns PTs may be located on an uppermost layer, for example, the seventh insulating layer IL7, and a first pattern PTs1 that is a central pattern from among the plurality of patterns PTs may be located on a lowermost layer, for example, the first insulating layer IL1. In a cross-sectional view, the plurality of patterns PTs of FIG. 25 may have a substantially V shape.

In cross-sectional structures of FIGS. 21 through 25, each of the plurality of patterns PTs may contact a signal line or a voltage line as shown in FIG. 6C, or the plurality of patterns PTs may contact each other as shown in FIG. 7, and the plurality of patterns PTs may contact a signal line or a voltage line.

FIGS. 8 through 13 are cross-sectional views illustrating a display apparatus according to an embodiment.

In FIGS. 8 through 13, various arrangement structures of the pattern layer PTL are illustrated. First, referring to FIG. 8, cross-sectional structures of the circuit layer PCL and a light-emitting device layer EDL stacked on the substrate 100 will be described in detail.

Figure 8:
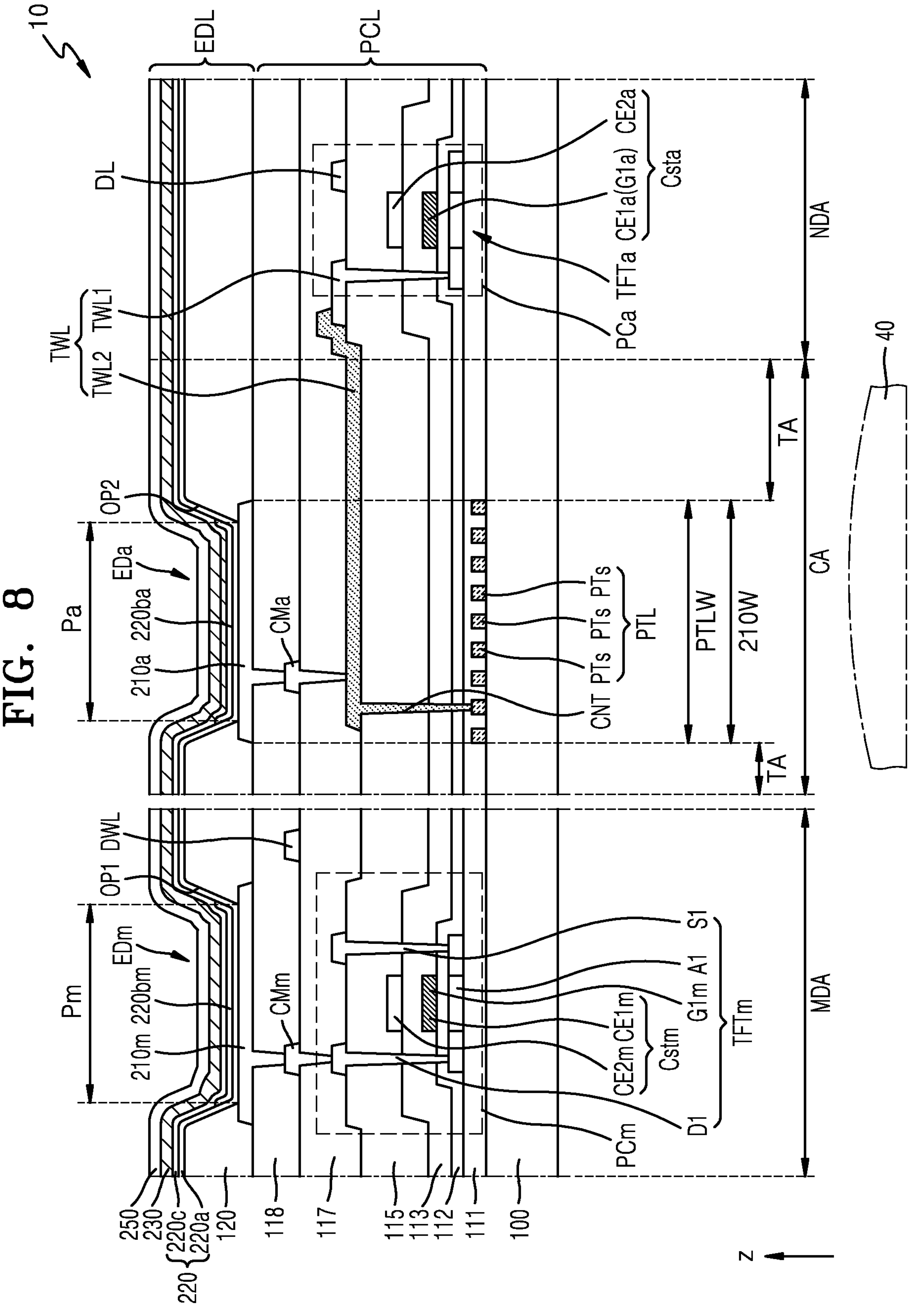
FIGS. 8, 9, 10, 11, 12 and 13 are cross-sectional views illustrating a display apparatus, according to an embodiment.

FIG. 8 is a cross-sectional view illustrating a part of the display panel 10 according to an embodiment, schematically illustrating parts of the main display area MDA, the component area CA, and the peripheral area NDA.

The main sub-pixel Pm is located in the main display area MDA, and the auxiliary sub-pixel Pa and the transmissive area TA are located in the component area CA. In the main display area MDA, the main pixel circuit PCm including the main thin-film transistor TFTm and a main storage capacitor Cstm, and the main organic light-emitting device EDm that is a display element connected to the main pixel circuit PCm may be located. In the component area CA, the auxiliary light-emitting device EDa may be located. In the peripheral area NDA, the auxiliary pixel circuit PCa including the auxiliary thin-film transistor TFTa and an auxiliary storage capacitor Csta may be located. In the component area CA and the peripheral area NDA, the connection wiring TWL that connects the auxiliary pixel circuit PCa to the auxiliary light-emitting device EDa may be located. In an embodiment, the main light-emitting device EDm and the auxiliary light-emitting device EDa may each be an organic light-emitting diode OLED.

A structure in which elements of the display panel 10 are stacked will now be described. The display panel 10 may include the substrate 100, the circuit layer PCL, and the light-emitting device layer EDL which are stacked.

The substrate 100 may be formed of an insulating material such as glass, quartz, or a polymer resin. The substrate 100 may be a rigid substrate, or a flexible substrate that is bendable, foldable, or rollable.

The circuit layer PCL may be located on the substrate. The circuit layer PCL may include a buffer layer 111. The buffer layer 111 may be located on the substrate 100, and may reduce or prevent penetration of a foreign material, moisture, or external air from the bottom of the substrate 100 and may planarize the substrate 100. The buffer layer 111 may include an inorganic material such as oxide or nitride, an organic material, or a combination of an organic material and an inorganic material, and may have a single or multi-layer structure including an inorganic material and an organic material. A barrier layer (not shown) may be further provided between the substrate 100 and the buffer layer 111 to prevent penetration of external air. In an embodiment, the buffer layer 111 may include silicon oxide ($SiO_2$), silicon nitride ($SiN_x$), or silicon oxynitride (SiON).

The main and auxiliary pixel circuits PCm and PCa, a first gate insulating layer 112, a second gate insulating layer 113, an interlayer insulating layer 115, and first and second planarization layers 117 and 118 may be located on the buffer layer 111. The main pixel circuit PCm may include the main thin-film transistor TFTm and the main storage capacitor Cstm, and the auxiliary pixel circuit PCa may include the auxiliary thin-film transistor TFTa and the auxiliary storage capacitor Csta.

The main thin-film transistor TFTm and the auxiliary thin-film transistor TFTa may be located on the buffer layer 111. The main thin-film transistor TFTm includes a semiconductor layer A1, a gate electrode G1*m*, a source electrode S1, and a drain electrode D1. The main thin-film transistor TFTm may be connected to the main organic light-emitting diode OLED and may drive the main light-emitting device EDm. The auxiliary thin-film transistor TFTa may be connected to the auxiliary light-emitting device EDa and may drive the auxiliary light-emitting device EDa. The auxiliary thin-film transistor TFTa has a structure similar to that of the main thin-film transistor TFTm, and thus the description of the main thin-film transistor TFTm may apply to the auxiliary thin-film transistor TFTa.

The semiconductor layer A1 may be located on the buffer layer 111, and may include polysilicon. In another embodiment, the semiconductor layer A1 may include amorphous silicon. In another embodiment, the semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel region, and a source region and a drain region doped with impurities.

The first gate insulating layer 112 may be provided to cover the semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (e.g., ZnO or $ZnO_2$). The first gate insulating layer 112 may have a single or multi-layer structure including the inorganic insulating material.

The first gate electrode G1*m* is located on the first gate insulating layer 112 to overlap the semiconductor layer A1. The gate electrode G1*m* may include molybdenum (Mo), aluminum (Al), copper (Cu), or titanium (Ti), and may have a single or multi-layer structure. For example, the gate electrode G1*m* may have a single-layer structure including Mo.

The second gate insulating layer 113 may cover the gate electrode G1*m*. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (e.g., ZnO or $ZnO_2$). The second gate insulating layer 113 may have a single or multi-layer structure including the inorganic insulating material.

An upper electrode CE2*m* of the main storage capacitor Cstm and an upper electrode CE2*a* of the auxiliary storage capacitor Csta may be located on the second gate insulating layer 113.

In the main display area MDA, the upper electrode CE2*m* of the main storage capacitor Cstm may overlap the gate electrode G1*m* located below the upper electrode CE2*m*. The gate electrode G1*m* and the upper electrode CE2*m* overlapping each other with the second gate insulating layer 113 disposed therebetween may constitute the main storage capacitor Cstm. The gate electrode G1*m* may be a lower electrode CE1*m* of the main storage capacitor Cstm.

In the peripheral area NDA, the upper electrode CE2*a* of the auxiliary storage capacitor Csta may overlap a gate electrode G1*a* of the auxiliary thin-film transistor TFTa below the upper electrode CE2*a*. The gate electrode G1*a* of the auxiliary thin-film transistor TFTa may be a lower electrode CE1*a* of the auxiliary storage capacitor Csta.

Each of the upper electrodes CE2*m* and CE2*a* may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The interlayer insulating layer 115 may cover the upper electrodes CE2*m* and CE2*a*. The interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (e.g., ZnO or $ZnO_2$). The interlayer insulating layer 115 may have a single or multi-layer structure including the inorganic insulating material.

The source electrode S1 and the drain electrode D1 may be located on the interlayer insulating layer 115. Each of the source electrode S1 and the drain electrode D1 may include a conductive material including molybdenum (Mo), aluminum (Al), copper (Cu), or titanium (Ti), and may have a single or multi-layer structure including the above material. For example, each of the source electrode S1 and the drain electrode D1 may have a multi-layer structure including Ti/Al/Ti.

The connection wiring TWL connected to the auxiliary pixel circuit PCa may be located on the interlayer insulating layer 115. The connection wiring TWL may extend from the peripheral area NDA to the component area CA, and may connect the auxiliary light-emitting device EDa to the auxiliary pixel circuit PCa. Also, the data line DL may be located on the interlayer insulating layer 115.

In an embodiment, the connection wiring TWL may include a first connection wiring TWL1 and a second connection wiring TWL2. The connection wiring TWL may correspond to the connection wiring TWL of FIG. 5B.

The first connection wiring TWL1 may be located in the peripheral area NDA, and may be connected to the auxiliary pixel circuit PCa, for example, the auxiliary thin-film transistor TFTa. The second connection wiring TWL2 may be connected to the first connection wiring TWL1, and may be located in the transmissive area TA of the component area CA. The second connection wiring TWL2 may be located on the first connection wiring TWL1, and may include a material different from that of the first connection wiring TWL1. An end of the second connection wiring TWL2 may cover an end of the first connection wiring TWL1.

Although not shown, the first connection wiring TWL1 may be located on the interlayer insulating layer 115 as shown in FIG. 6 and the second connection wiring TWL2 may be located on the first planarization layer 117. In this case, the first connection wiring TWL1 and the second connection wiring TWL2 may be connected to each other through a contact hole defined in the first planarization layer 117.

The first connection wiring TWL1 may include a conductive material including molybdenum (Mo), aluminum (Al), copper (Cu), or titanium (Ti), and may have a single or multi-layer structure including the above material.

The second connection wiring TWL2 may include a transparent conductive material. For example, the connection wiring TWL may include a transparent conductive oxide (TCO). The connection wiring TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The first connection wiring TWL1 may have a higher conductivity than the second connection wiring TWL2. Because the first connection wiring TWL1 is located in the peripheral area NDA and thus a light transmittance does not need to be secured, the first connection wiring TWL1 may include a material having a lower light transmittance but a higher conductivity than the second connection wiring TWL2. Accordingly, a resistance value of the connection wiring TWL may be minimized.

The first and second planarization layers 117 and 118 may be located to cover the source electrode S1, the drain electrode D1, and the connection wiring TWL. The first and second planarization layers 117 and 118 may have a flat top surface so that a main pixel electrode 210*m* and an auxiliary pixel electrode 210*a* located on the first and second planarization layers 117 and 118 are flat.

Each of the first and second planarization layers 117 and 118 may include an organic material or an inorganic material, and may have a single or multi-layer structure. The first and second planarization layers 117 and 118 may include the first planarization layer 117 and the second planarization layer 118. Accordingly, a conductive pattern such as a wiring may be formed between the first planarization layer 117 and the second planarization layer 118, which may lead to high integration. Contact metals CMm and CMa and a data connection line DWL may be located on the first planarization layer 117.

The first planarization layer 117 may include benzocyclobutene (BCB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, or a vinyl alcohol-based polymer. The first planarization layer 117 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (e.g., ZnO or $ZnO_2$). When the first planarization layer 117 is formed, a layer may be formed and then chemical mechanical polishing may be performed on a top surface of the layer in order to provide a flat top surface.

The first planarization layer 117 may cover the main and auxiliary pixel circuits PCm and PCa. The second planarization layer 118 may be located on the first planarization layer 117, and may have a flat top surface so that the main and auxiliary pixel electrodes 210*m* and 210*a* are flat.

The main and auxiliary light-emitting devices EDm and EDa are located on the second planarization layer 118. The main and auxiliary pixel electrodes 210*m* and 210*a* of the main and auxiliary light-emitting devices EDM and EDa may be respectively connected to the main and auxiliary pixel circuits PCm and PCa through the contact metals CMm and CMa located on the first planarization layer 117.

Each of the main pixel electrode 210*m* and the auxiliary pixel electrode 210*a* may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). Each of the main pixel electrode 210*m* and the auxiliary pixel electrode 210*a* may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, each of the main pixel electrode 210*m* and the auxiliary pixel electrode 210*a* may have a structure in which films formed of ITO, IZO, ZnO, or $In_2O_3$ are located over/under the reflective film. In this case, each of the main pixel electrode 210*m* and the auxiliary pixel electrode 210*a* may have a stacked structure including ITO/Ag/ITO.

A pixel-defining film 120 located on the second planarization layer 118 may cover edges of the main pixel electrode 210*m* and the auxiliary pixel electrode 210*a*, and may have a first opening OP1 and a second opening OP2 through which central portions of the main pixel electrode 210*m* and the auxiliary pixel electrode 210*a* are exposed. Sizes and shapes of emission areas, that is, the main and auxiliary sub-pixels Pm and Pa, of the main and auxiliary light-emitting devices EDm and EDa are defined by the first opening OP1 and the second opening OP2.

The pixel-defining film 120 may increase a distance between edges of the pixel electrodes 210*m* and 210*a* and a counter electrode 230 located over the pixel electrodes 210*m* and 210*a* to prevent an arc or the like from occurring on the edges of the pixel electrodes 210*m* and 210*a*. The pixel-defining film 119 may be formed of an organic insulating material such as polyimide, polyamide, acrylic resin, benzocyclobutene, hexamethyldisiloxane (HMDSO), or phenolic resin, by using spin coating or the like.

A main emission layer 220*bm* and an auxiliary emission layer 220*ba* are respectively located in the first opening OP1 and the second opening OP2 of the pixel-defining film 119 to respectively correspond to the main pixel electrode 210*m* and the auxiliary pixel electrode 210*a*. Each of the main emission layer 220*bm* and the auxiliary emission layer 220*ba* may include a high molecular weight material or a low molecular weight material, and may emit red light, green light, blue light, or white light.

An organic functional layer 220 may be located over and/or under the main emission layer 220*bm* and the auxiliary emission layer 220*ba*. The organic functional layer 220 may include a first functional layer 220*a* and/or a second functional layer 220*c*. The first functional layer 220*a* or the second functional layer 220*c* may be omitted.

The first functional layer 220*a* may be located under the main emission layer 220*bm* and the auxiliary emission layer 220*ba*. The first functional layer 220*a* may have a single or multi-layer structure including an organic material. The first functional layer 220*a* may be a hole transport layer (HTL) having a single-layer structure. Alternatively, the first functional layer 220*a* may include a hole injection layer (HIL) and a hole transport layer (HTL). The first functional layer 220*a* may be integrally formed to correspond to the main and auxiliary light-emitting devices EDm and EDa included in the main display area MDA and the component area CA.

The second functional layer 220*c* may be located on the main emission layer 220*bm* and the auxiliary emission layer 220*ba*. The second functional layer 220*c* may have a single or multi-layer structure including an organic material. The second functional layer 220*c* may include an electron transport layer (ETL) and/or an electron injection layer (EIL). The second functional layer 220*c* may be integrally formed to correspond to the main and auxiliary light-emitting devices EDm and EDa included in the main display area MDA and the component area CA.

The counter electrode 230 is located on the second functional layer 220*c*. The counter electrode 230 may include a conductive material having a low work function. For example, the counter electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 230 may further include a layer such as ITO, IZO, ZnO, or $In_2O_3$ on the (semi) transparent layer including the above material. The counter electrode 230 may be integrally formed to correspond to the main and auxiliary light-emitting devices EDm and EDa included in the main display area MDA and the component area CA.

Layers from the main pixel electrode 210*m* to the counter electrode 230 formed in the main display area MDA may constitute the main light-emitting device EDm. Layers from the auxiliary pixel electrode 210*a* to the counter electrode 230 formed in the component area CA may constitute the auxiliary light-emitting device EDa.

An upper layer 250 including an organic material may be formed on the counter electrode 230. The upper layer 250 may protect the counter electrode 230 and may improve light extraction efficiency. The upper layer 250 may include an organic material having a higher refractive index than that of the counter electrode 230. Alternatively, the upper layer 250 may be formed by stacking layers having different refractive indexes. For example, the upper layer 250 may be formed by stacking a high refractive index layer, a low refractive index layer, and a high refractive index layer. In this case, a refractive index of the high refractive index layer may be greater than or equal to 1.7 and a refractive index of the low refractive index layer may be less than or equal to 1.3.

The upper layer 250 may additionally include LiF. Alternatively, the upper layer 250 may additionally include an inorganic insulating material such as silicon oxide ($SiO_2$) or silicon nitride ($SiN_x$).

The pattern layer PTL may overlap the auxiliary sub-pixel Pa in the component area CA. This may mean that the pattern layer PTL overlaps an auxiliary display element, that is, the auxiliary light-emitting device EDa. In the present embodiment, because the auxiliary light-emitting device EDa of the auxiliary sub-pixel Pa is located in the component area CA and the auxiliary pixel circuit PCa is located in the peripheral area NDA, the pattern layer PTL may overlap the auxiliary light-emitting device EDa. In this case, when the pattern layer PTL overlaps the auxiliary light-emitting device EDa, it may mean that the pattern layer PTL overlaps the auxiliary pixel electrode 210*a* in a plan view.

In the pattern layer PTL, the plurality of patterns PTs may be spaced apart from one another with a central pattern disposed in a center of the plurality of patterns PTs. The plurality of patterns PTs may have a concentric shape and different diameters, as described with reference to FIGS. 6A through 6C and FIG. 7.

The pattern layer PTL may be located between the substrate 100 and the auxiliary pixel electrode 210*a*.

In an embodiment, as shown in FIG. 8, the pattern layer PTL may be located between the substrate 100 and the buffer layer 111. In this case, for example, the pattern layer PTL may include the same material as that of the bottom metal layer BML of FIG. 2B. In an embodiment, the pattern layer PTL may be electrically connected to the auxiliary pixel electrode 210*a*. In FIG. 8, the pattern layer PTL may be connected to a connection wiring, for example, the second connection wiring TWL2 through a contact portion CNT, and the second connection wiring TWL2 may be connected to the auxiliary pixel electrode 210*a* through the contact metal CMa, so that the pattern layer PTL is electrically connected to the auxiliary pixel electrode 210*a*.

Figure 9:
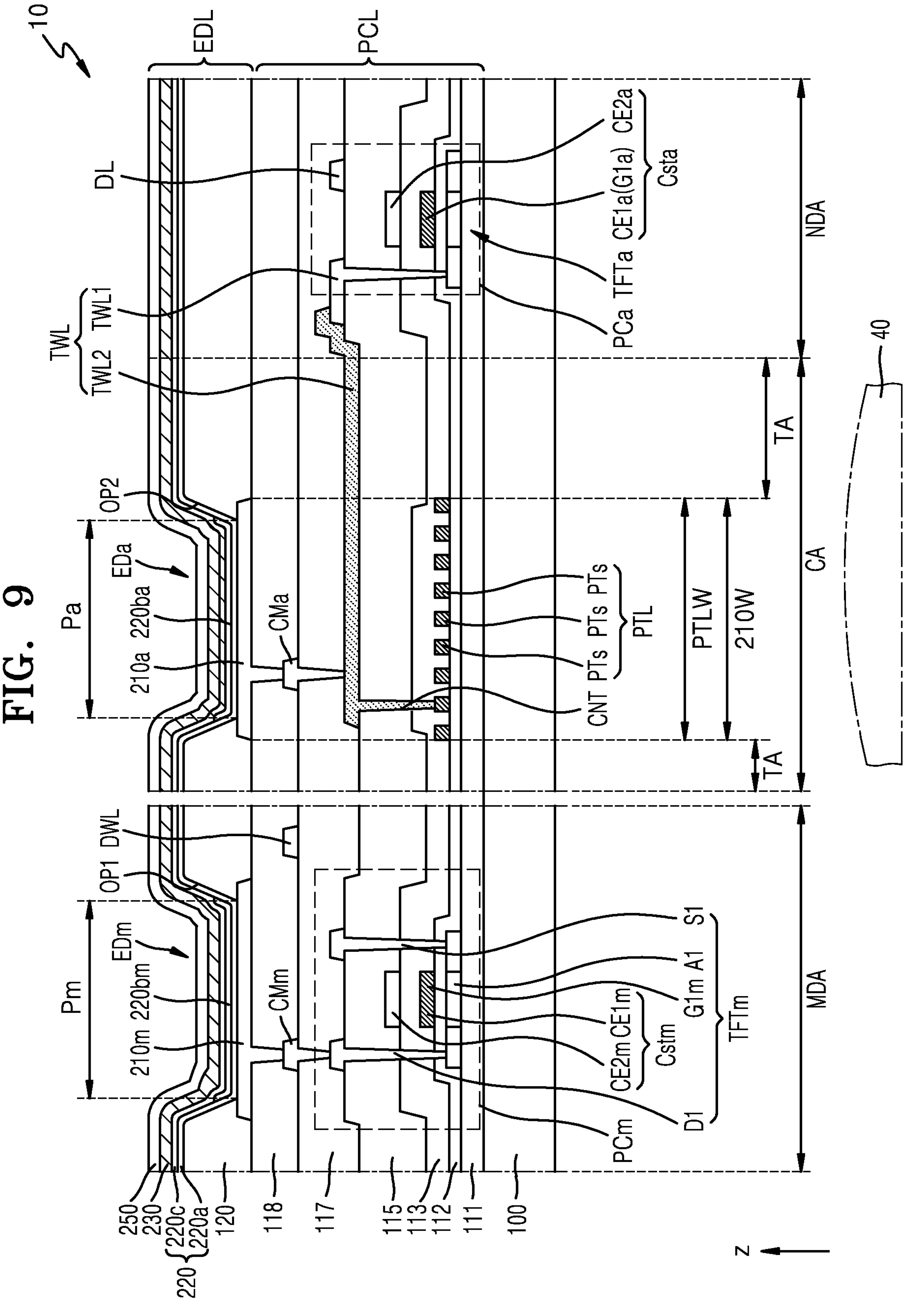

In another embodiment, as shown in FIG. 9, the pattern layer PTL may be located on the first gate insulating layer 112 and may include the same material as that of the gate electrodes G1*m* and G1*a* of the main and auxiliary pixel circuits PCm and PCa.

Figure 10:
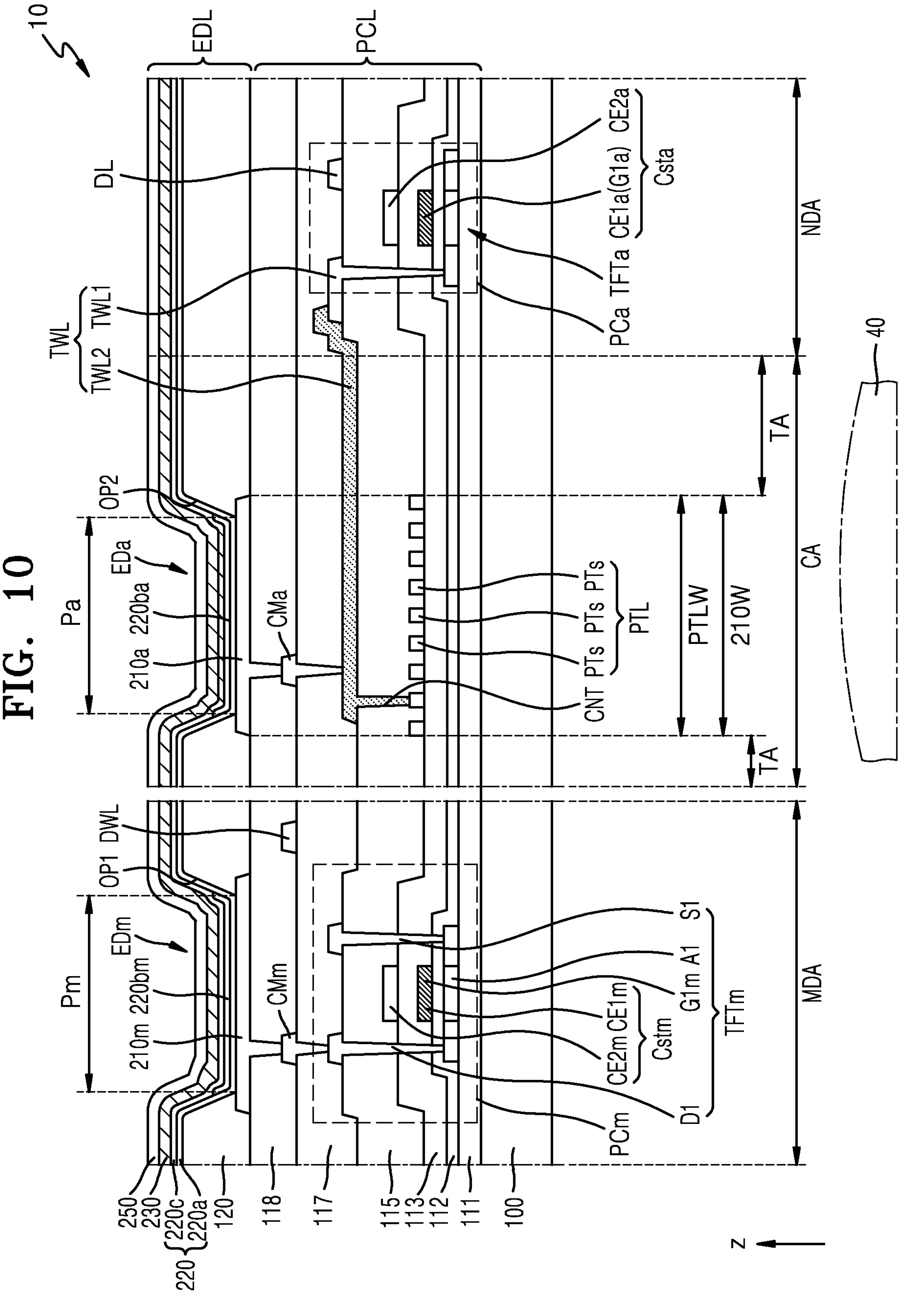

In another embodiment, as shown in FIG. 10, the pattern layer PTL may be located on the second gate insulating layer 113, and in this case, may include the same material as that of the upper electrodes CE2*m* and CE2*a*.

Figure 11:
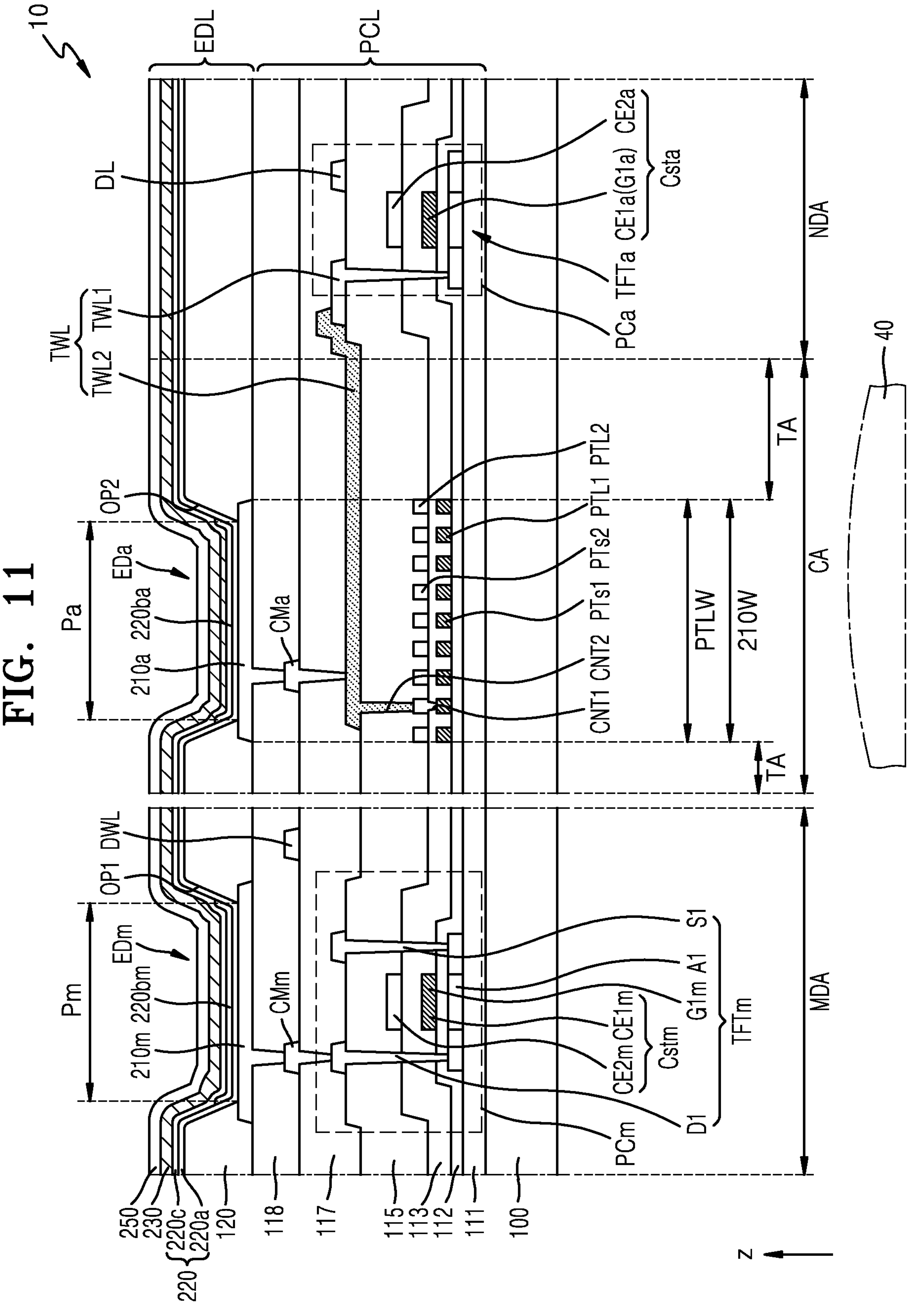

In another embodiment, as shown in FIG. 11, as a mixed structure of FIGS. 9 and 10, a first pattern layer PTL1 located on the first gate insulating layer 112 and a second pattern layer PTL2 located on the second gate insulating layer 113 may be provided. The first pattern layer PTL1 and the second pattern layer PTL2 may respectively include a plurality of first patterns PTs1 and a plurality of second patterns PTs2. The first pattern layer PTL1 and the second pattern layer PTL2 may substantially overlap each other, and in this case, the plurality of first patterns PTs1 and the plurality of second patterns PTs2 may completely overlap each other or the plurality of first patterns PTs1 and the plurality of second patterns PTs2 may be alternately arranged so that the plurality of second patterns PTs2 are located between the plurality of first patterns PTs1. The first pattern layer PTL1 may be connected to the second pattern layer PTL2 through a first contact portion CNT1, and the second pattern layer PTL2 and a connection wiring, for example, the second connection wiring TWL2, may be connected to each other through a second contact portion CNT2.

Figure 12:
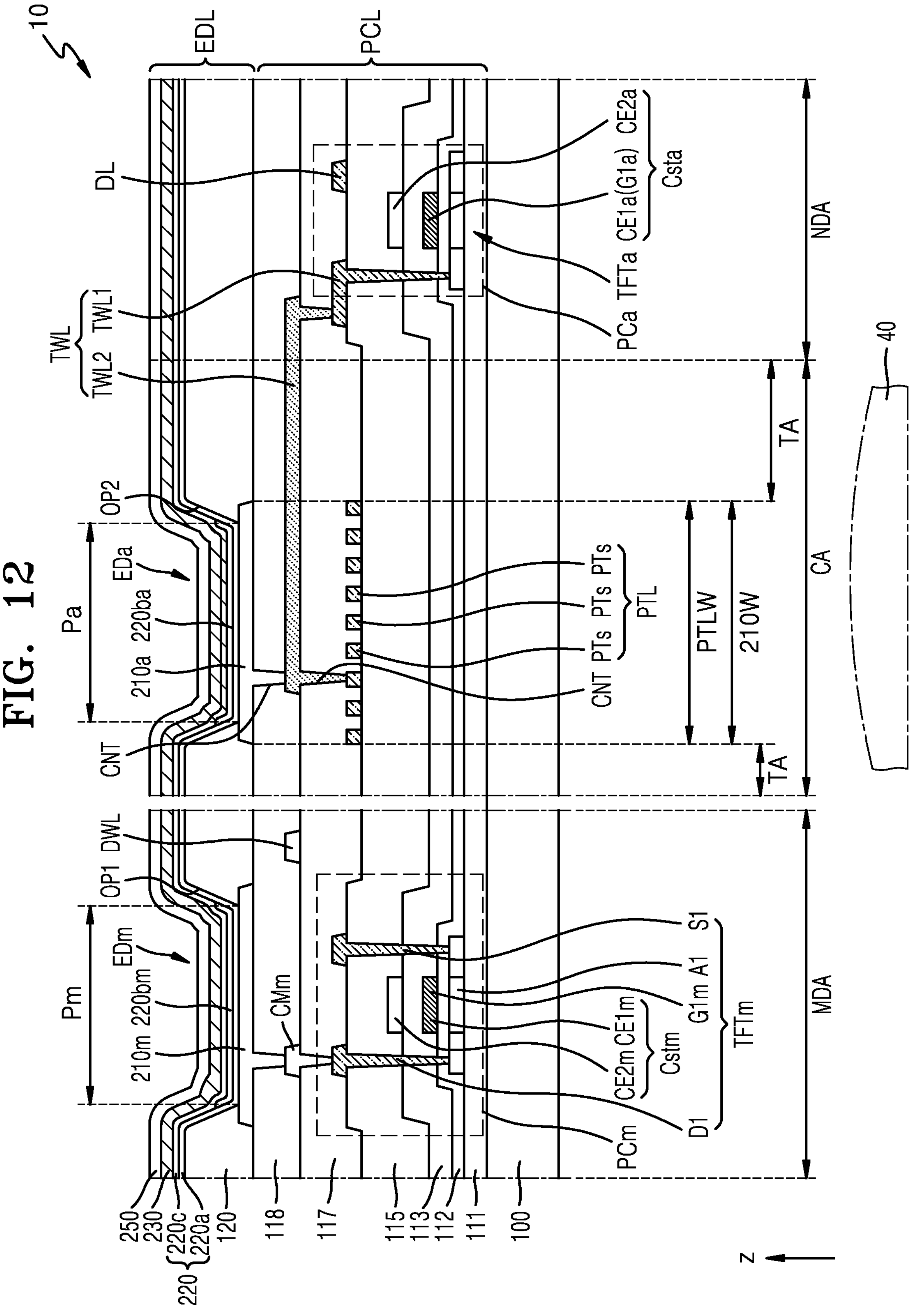

In another embodiment, as shown in FIG. 12, the pattern layer PTL may be located on the interlayer insulating layer 115, and in this case, may include the same material as that of the source electrode S1 and/or the drain electrode D1 of the thin-film transistor.

Figure 13:
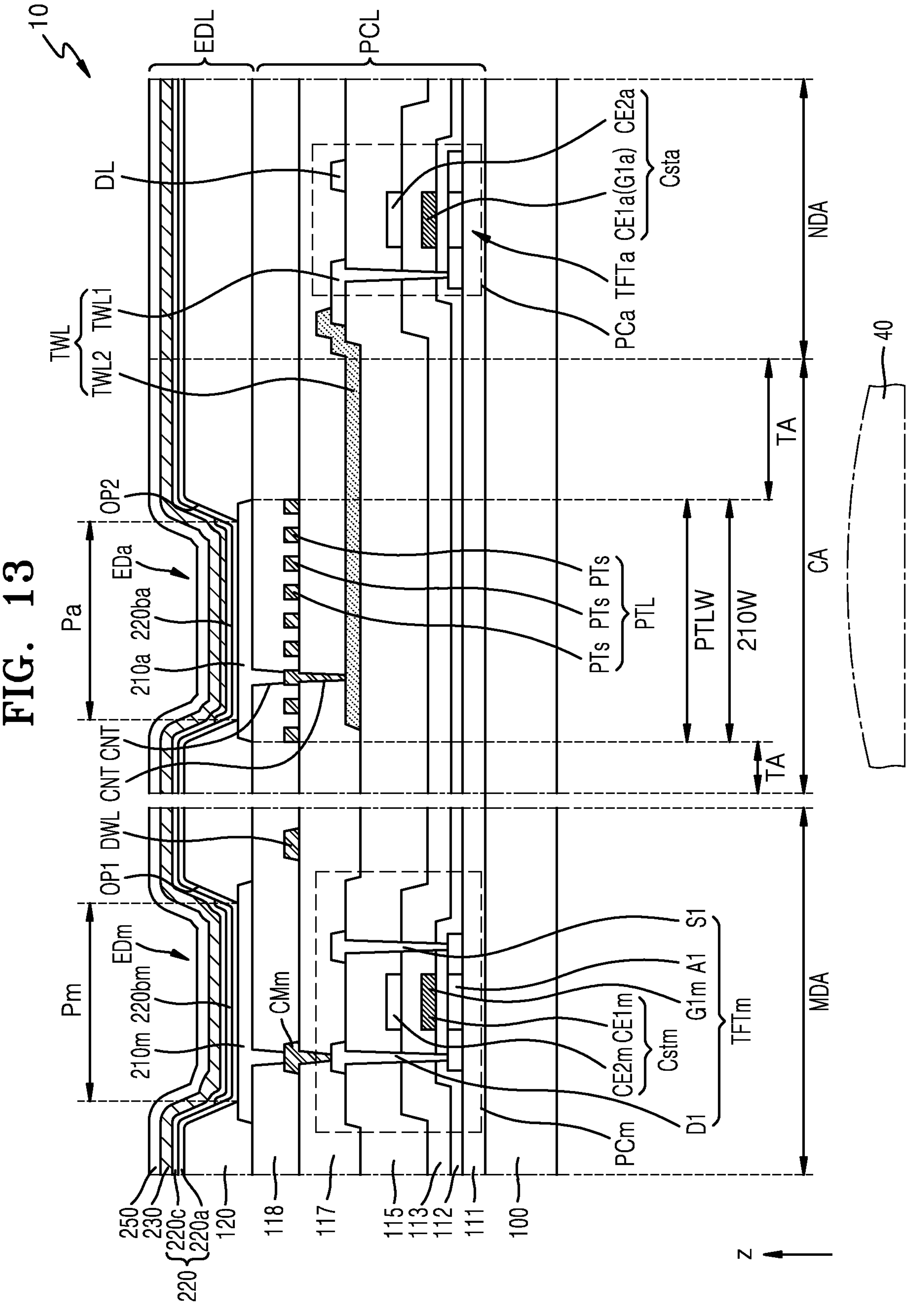

In another embodiment, as shown in FIG. 13, the pattern layer PTL may be located between a connection wiring, for example, the second connection wiring TWL2, and the auxiliary pixel electrode 210*a*. In this case, the pattern layer PTL may include the same material as that of the contact metal CMm. The pattern layer PTL and the second connection wiring TWL2, and the second connection wiring TWL2 and the auxiliary pixel electrode 210*a* may be electrically connected to each other through contact holes CNT. As long as the pattern layer PTL is located between the substrate 100 and the auxiliary pixel electrode 210*a* to correspond to the auxiliary pixel electrode 210*a*, the pattern layer PTL may be implemented in various ways as described above.

Referring back to FIG. 8, in an embodiment, a width PTLW of the pattern layer PTL may be less than or equal to a width 210W of the auxiliary pixel electrode 210*a*. An orthogonal projection image of the pattern layer PTL onto the substrate 100 may completely overlap the auxiliary pixel electrode 210*a*. Accordingly, the area of the pattern layer PTL may be less than or equal to the area of the auxiliary pixel electrode 210*a*.

In a comparative example, when a width of a first conductive layer is greater than a width of an auxiliary pixel electrode, a pattern of the first conductive layer may be exposed to the outside of the auxiliary sub-pixel, thereby reducing visibility. Rather, reflected light may be re-reflected by the first conductive layer and may re-enter a component, thereby exacerbating ghosting in which an unintended double image is formed.

Figure 14:
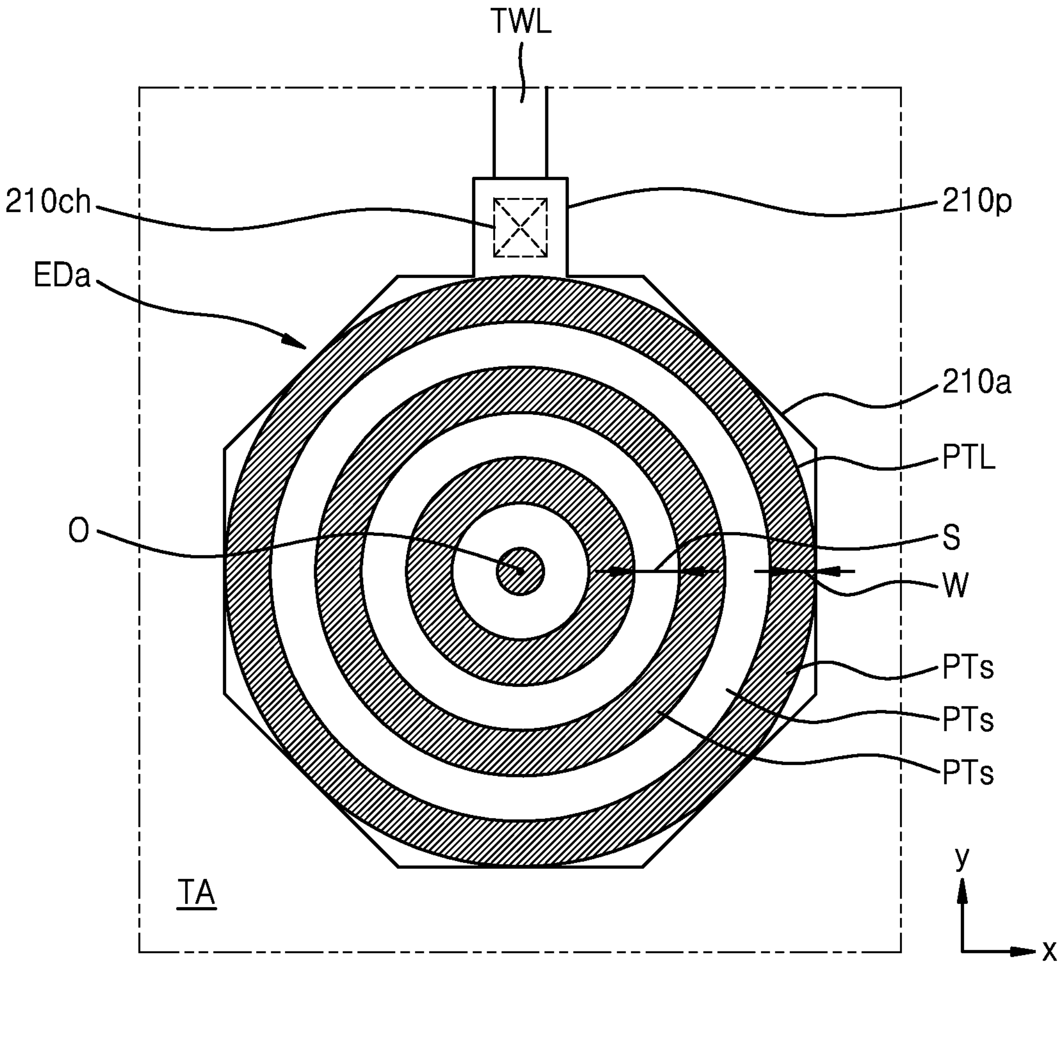
FIG. 14 is a plan view illustrating a pattern layer, according to an embodiment.
Figure 15:
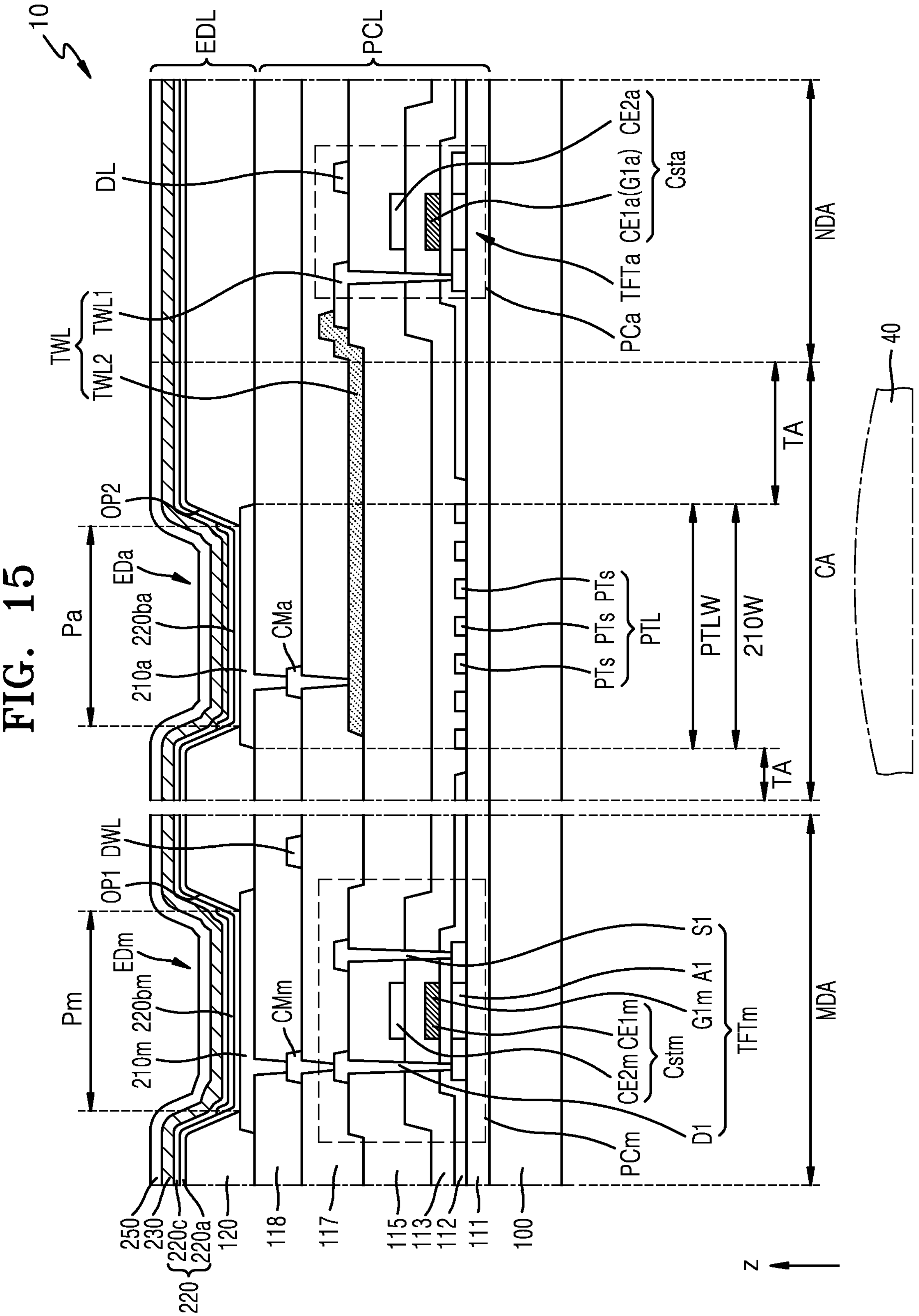
FIGS. 15 and 16 are cross-sectional views illustrating the pattern layer of FIG. 14.
Figure 16:
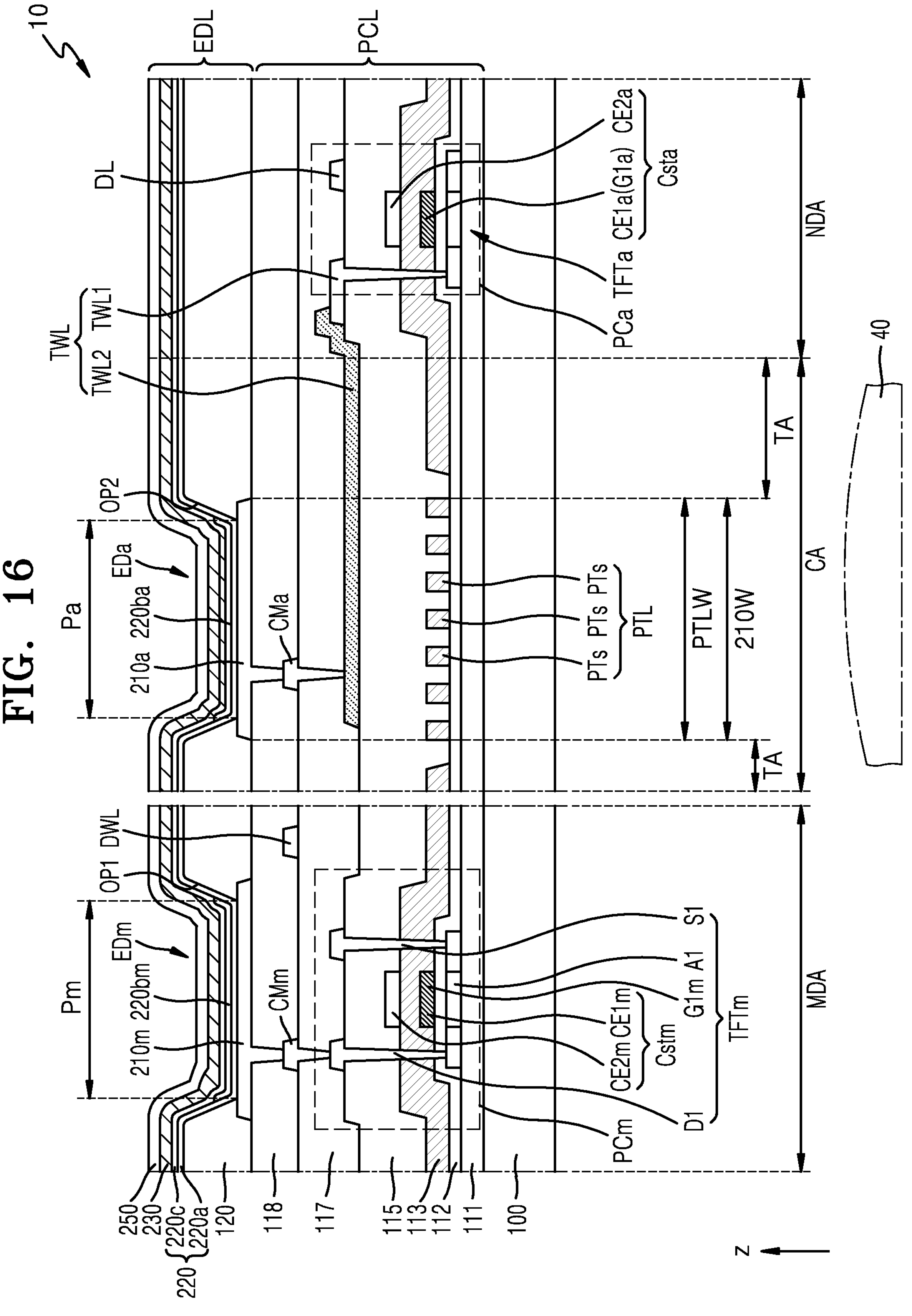

FIG. 14 is a plan view illustrating a pattern layer, according to an embodiment. FIGS. 15 and 16 are cross-sectional views illustrating the pattern layer of FIG. 14.

In FIGS. 14 through 16, there is a difference from the above embodiments in that the pattern layer PTL is formed of an insulating material. A shape and a stacked structure of the pattern layer PTL are substantially the same as those described with reference to FIG. 8 or the like, and thus, the following will focus on a difference.

Referring to FIG. 14, the pattern layer PTL may include an insulating material. For example, the pattern layer PTL may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (e.g., ZnO or $ZnO_2$). That is, the pattern layer PTL may include the same material as a material for forming an insulating layer.

In an embodiment, the plurality of patterns PTs may have the first line width W and the first separation distance S. In this case, the first separation distance S of the plurality of patterns PTs may be greater than or equal to the first line width W. In FIG. 14, the first separation distance S and the first line width W of the plurality of patterns PTs are the same. Because the pattern layer PTL has a concentric structure as shown in FIG. 6A or the like but includes an insulating material unlike in the above embodiments where the pattern layer PTL includes a metal material, a width of each of the plurality of patterns PTs of the pattern layer PTL may be greater than that in the above embodiments. For example, the first line width W of each of the plurality of patterns PTs may be greater than or equal to 2.0 μm and less than or equal to 4.0 μm. It is not easy in a process for the first line width W of the plurality of patterns PTs including an insulating material to be less than 2.0 μm, and when the first line width W exceeds 4.0 μm, scattering and diffraction of reflected light by the plurality of patterns PTs may be reduced.

FIGS. 15 and 16 illustrate a cross-sectional structure of the pattern layer PTL. In an embodiment, as shown in FIG. 15, the pattern layer PTL and the first gate insulating layer 112 may be formed of the same material and may be located on the same layer. Alternatively, as shown in FIG. 16, the pattern layer PTL and the second gate insulating layer 113 may be formed of the same material and may be located on the same layer may be formed on the same layer.

Figure 17:
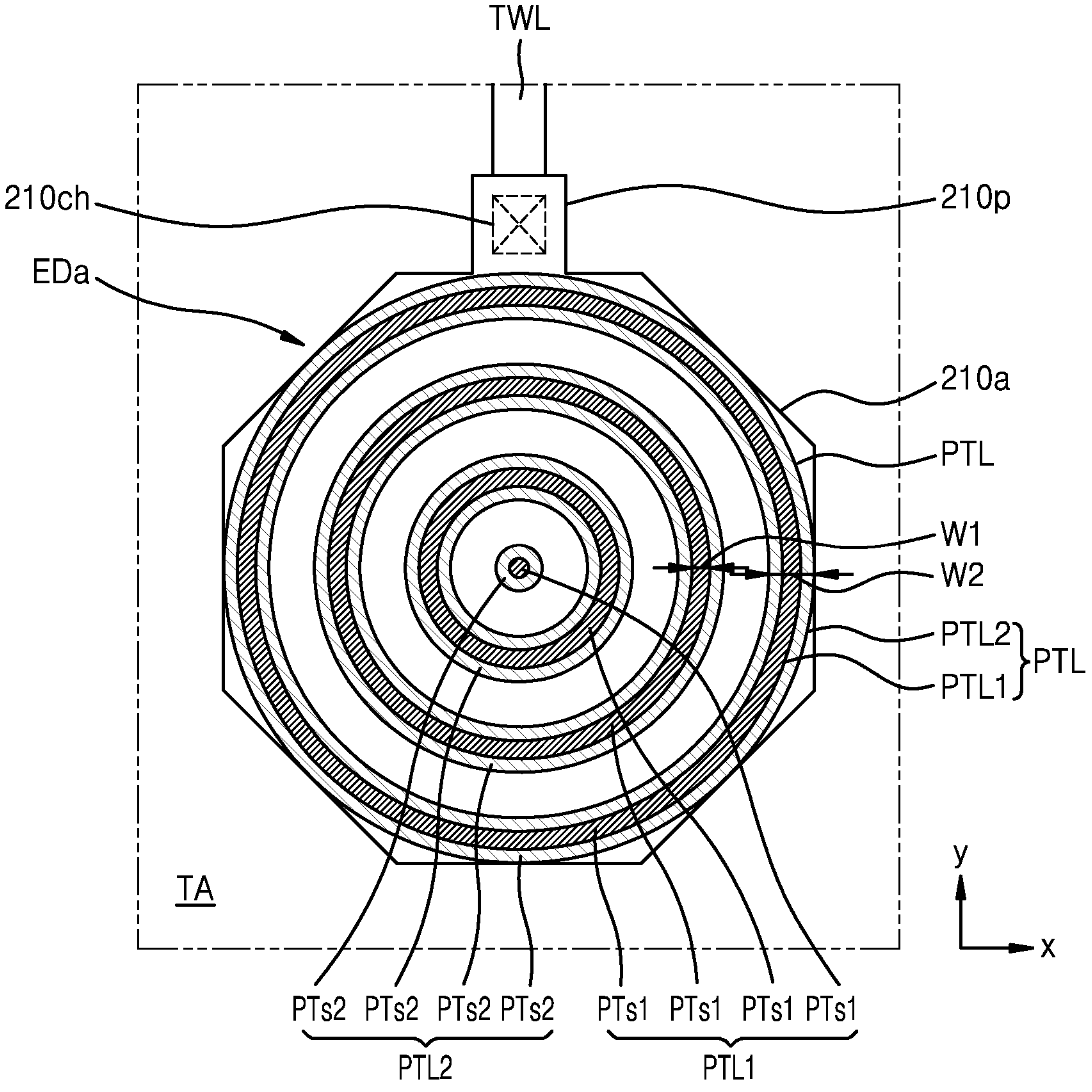
FIG. 17 is a plan view illustrating a pattern layer, according to an embodiment.
Figure 18:
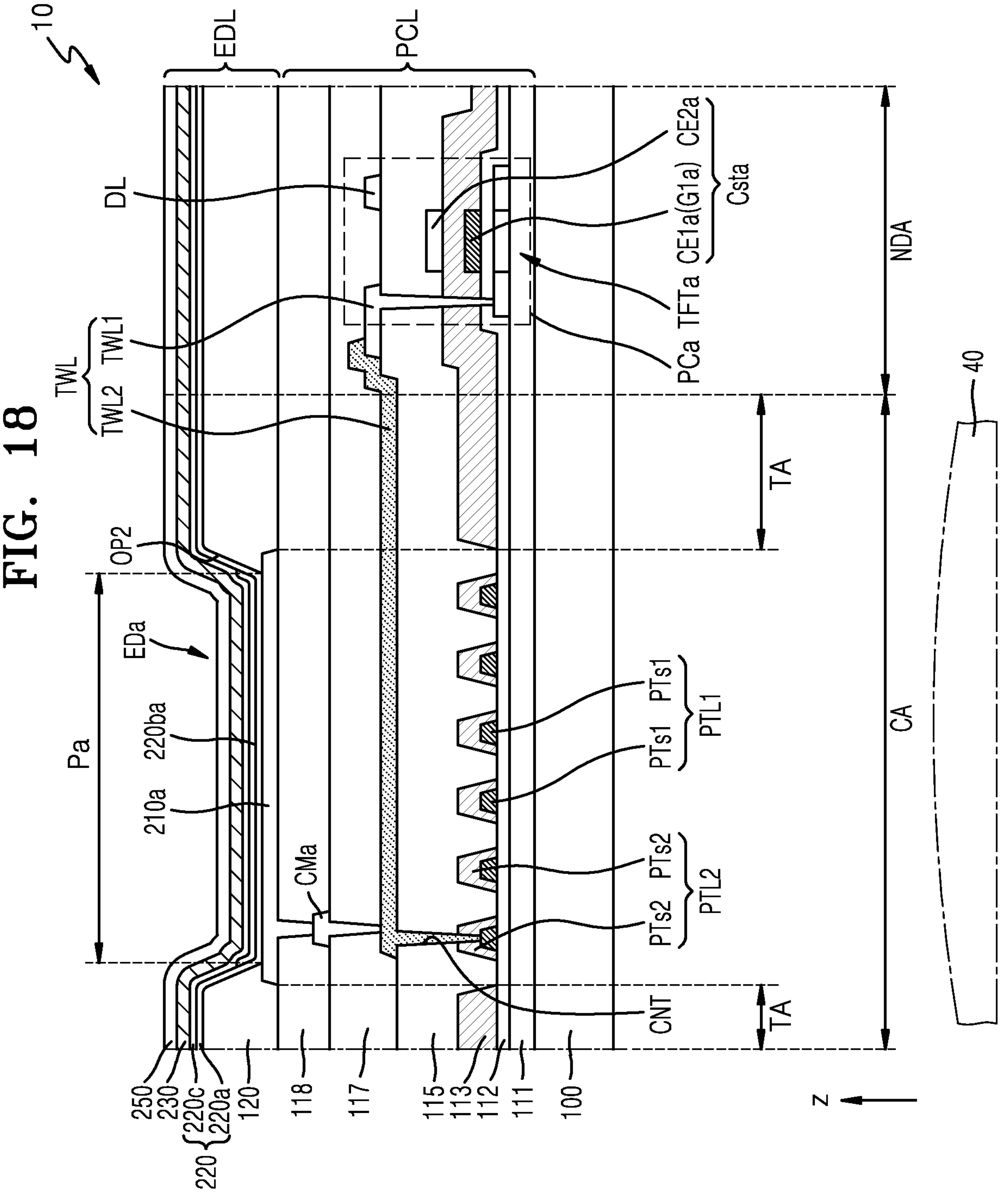
FIG. 18 is a cross-sectional view illustrating the pattern layer of FIG. 17.
Figure 19:
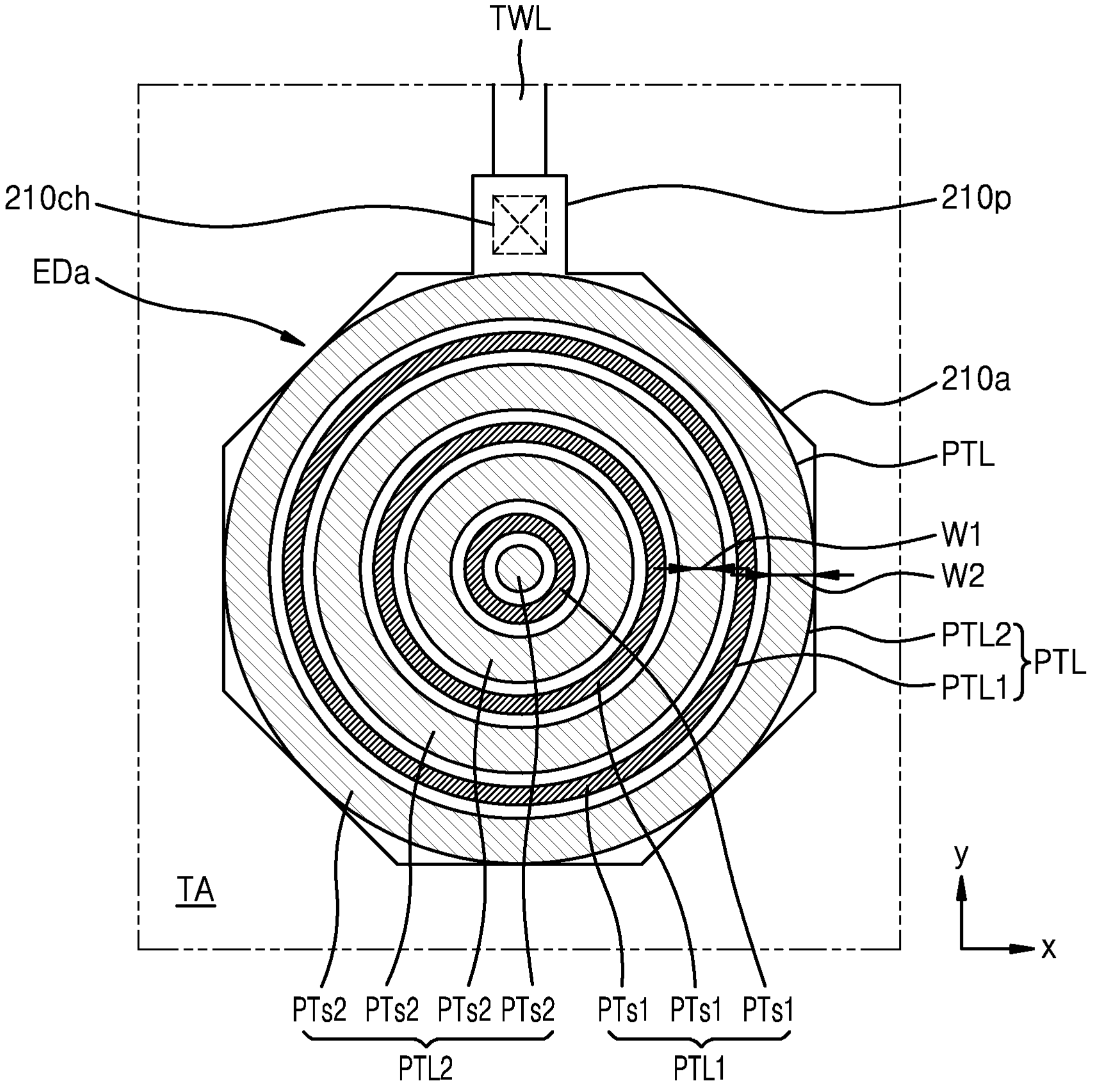
FIG. 19 is a plan view illustrating a pattern layer, according to an embodiment.
Figure 20:
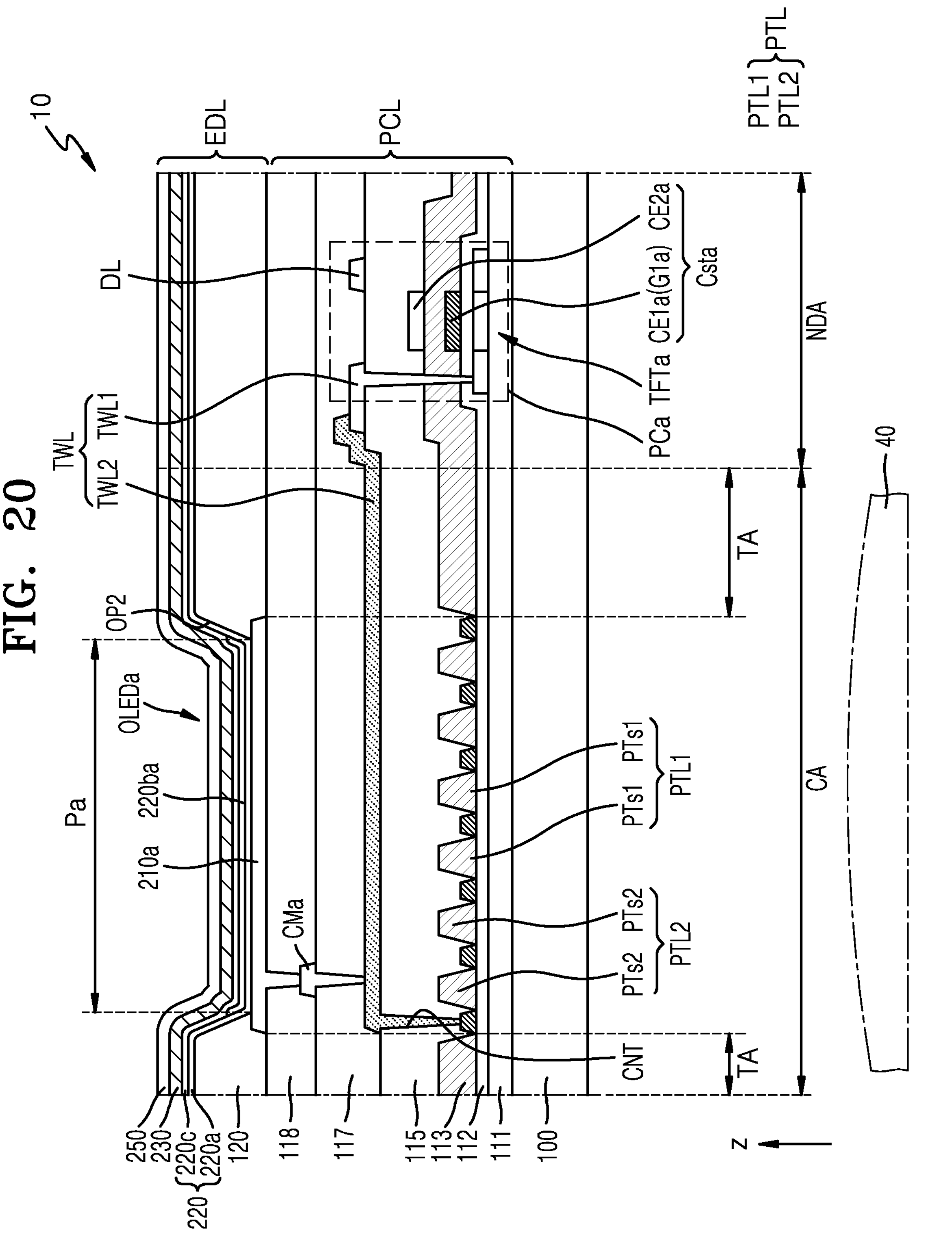
FIG. 20 is a cross-sectional view illustrating the pattern layer of FIG. 19.

FIG. 17 is a plan view illustrating a pattern layer, according to an embodiment. FIG. 18 is a cross-sectional view illustrating the pattern layer of FIG. 17. FIG. 19 is a plan view illustrating a pattern layer according to an embodiment. FIG. 20 is a cross-sectional view illustrating the pattern layer of FIG. 19.

In FIGS. 17 through 20, there is a difference from the above embodiments in that the pattern layer PTL includes both the first pattern layer PTL1 including a metal material and the second pattern layer PTL2 including an inorganic insulating material. A shape and a stacked structure of the pattern layer PTL are substantially the same as those described with reference to FIG. 8 or the like, and thus, the following will focus on a difference.

The first pattern layer PTL1 may include a plurality of first patterns PTs1 and the second pattern layer PTL2 may include a plurality of second patterns PTs2. In the plurality of first patterns PTs1 and the plurality of second patterns PTs2, a distance between the patterns may be less than or equal to twice a line width between the patterns, like in the plurality of patterns PTs of FIGS. 6A and 6B.

Referring to FIGS. 17 and 18, the first pattern layer PTL1 including a metal material and the second pattern layer PTL2 including an inorganic insulating material may overlap each other. As shown in FIG. 17, the first pattern layer PTL1 may be completely overlapped with the second pattern layer PTL2. For example, the second pattern layer PTL2 may completely cover the first pattern layer PTL1 in a plan view. Because the first pattern layer PTL1 includes a metal material and the second pattern layer PTL2 includes an inorganic insulating material, the first pattern layer PTL1 may be more precisely patterned than the second pattern layer PTL2. Accordingly, a width W1 of the plurality of first patterns PTs1 of the first pattern layer PTL1 may be less than a width W2 of the plurality of second patterns PTs2 of the second pattern layer PTL2. In an embodiment, the width W1 of the plurality of first patterns PTs1 may be greater than or equal to 1.2 μm and less than or equal to 3.0 μm, and the width W2 of the plurality of second patterns PTs2 may be greater than or equal to 2.0 μm and less than or equal to 4.0 μm.

As shown in FIG. 18, the plurality of first patterns PTs1 may be located on the a first gate insulating layer 112 and the plurality of second patterns PTs2 may be located on the plurality of first patterns PTs1. The plurality of second patterns PTs2 may cover the plurality of first patterns PTs1. For example, the plurality of first patterns PTs1 may include the same material as that of the gate electrode Gla, and the plurality of second patterns PTs2 may include the same material as that of the second gate insulating layer 113.

Referring to FIGS. 19 and 20, the first pattern layer PTL1 including a metal material and the second pattern layer PTL2 including an inorganic insulating material may not overlap each other. As shown in FIG. 19, the first pattern layer PTL1 and the second pattern layer PTL2 may be alternately arranged. Because the width W1 of the plurality of first patterns PTs1 of the first pattern layer PTL1 is less than the width W2 of the plurality of second patterns PTs2 of the second pattern layer PTL2, the plurality of first patterns PTs1 may be located between the plurality of second patterns PTs2. In a manufacturing process, because the plurality of first patterns PTs1 are first formed and then the plurality of second patterns PTs2 are formed, the plurality of second patterns PTs2 may be located between the plurality of first patterns PTs1.

As shown in FIG. 20, the plurality of first patterns PTs1 may be located on the first gate insulating layer 112 and the plurality of second patterns PTs2 may be located between the plurality of first patterns PTs1. The plurality of first patterns PTs1 may be exposed between the plurality of second patterns PTs2. For example, the plurality of first patterns PTs1 may include the same material as that of the gate electrode Gla, and the plurality of second patterns PTs2 may include the same material as that of the second gate insulating layer 113.

Although only a display panel and an electronic device including the same have been mainly described, the disclosure is not limited thereto. For example, a method of manufacturing the display panel and the electronic device may also be within the scope of the disclosure.

Embodiments provide structures of a display panel including a transmissive area in a display area and an electronic device including the display panel. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display panel comprising:

a substrate comprising a main display area, a component area, and a peripheral area;

a main pixel circuit and a main display element connected to the main pixel circuit, the main pixel circuit and the main display element being located in the main display area;

an auxiliary display element located in the component area and including an auxiliary pixel electrode;

an auxiliary pixel circuit located in an area other than the component area;

a connection wiring connecting the auxiliary display element to the auxiliary pixel circuit; and a pattern layer arranged between the substrate and the auxiliary display element to overlap the auxiliary display element, the pattern layer comprising a plurality of patterns having a concentric shape in a plan view, wherein the connection wiring is disposed on a different layer than the auxiliary pixel electrode, and the connection wiring disposed in the component area includes a transparent conductive material.

2. The display panel of claim 1, wherein the pattern layer comprises a metal material.

3. The display panel of claim 1, wherein the plurality of patterns have a first line width and a first separation distance, and wherein the first separation distance is greater than or equal to the first line width.

4. The display panel of claim 3, wherein the first separation distance is less than or equal to twice the first line width.

5. The display panel of claim 4, wherein the first line width is greater than or equal to 1.2 μm and less than or equal to 3.0 μm.

6. The display panel of claim 1, wherein a constant voltage is applied to the pattern layer.

7. The display panel of claim 1, wherein the auxiliary display element comprises an auxiliary counter electrode disposed on the auxiliary pixel electrode, and an auxiliary intermediate layer located between the auxiliary pixel electrode and the auxiliary counter electrode, and wherein the pattern layer is electrically connected to the auxiliary pixel electrode.

8. The display panel of claim 1, wherein the pattern layer comprises an inorganic insulating material.

9. The display panel of claim 8, wherein the plurality of patterns have a first line width and a first separation distance, and wherein the first line width is greater than or equal to 2.0 μm and less than or equal to 4.0 μm.

10. The display panel of claim 8, wherein the connection wiring at least partially overlaps the pattern layer and an insulating layer is interposed between the connection wiring and the pattern layer.

11. The display panel of claim 1, wherein the auxiliary display element comprises an auxiliary counter electrode disposed on the auxiliary pixel electrode, and an auxiliary intermediate layer located between the auxiliary pixel electrode and the auxiliary counter electrode, and wherein a width of the pattern layer is less than or equal to a width of the auxiliary pixel electrode.

12. The display panel of claim 1, wherein the pattern layer comprises: a first pattern layer comprising a metal material; and a second pattern layer comprising an inorganic insulating material.

13. The display panel of claim 12, wherein the first pattern layer comprises a plurality of first patterns having a concentric shape in a plan view and the second pattern layer comprises a plurality of second patterns having a concentric shape in the plan view, and wherein the plurality of first patterns and the plurality of second patterns overlap each other.

14. The display panel of claim 12, wherein the first pattern layer comprises a plurality of first patterns having a concentric shape in a plan view and the second pattern layer comprises a plurality of second patterns having a concentric shape in the plan view, and wherein the plurality of first patterns are located between the plurality of second patterns.

15. The display panel of claim 1, wherein the pattern layer further comprises a plurality of connection patterns respectively connecting adjacent patterns of the plurality of patterns.

16. The display panel of claim 15, wherein the plurality of connection patterns are not located on a same line.

17. The display panel of claim 1, wherein each of the plurality of patterns is floated.

18. An electronic device comprising:

a display panel comprising a main display area, a component area, and a peripheral area; and a component arranged under the display panel to correspond to the component area, wherein the display panel comprises:

a substrate;

a main pixel circuit and a main display element connected to the main pixel circuit, the main pixel circuit and the main display element being located in the main display area;

an auxiliary display element located in the component area and including an auxiliary pixel electrode;

an auxiliary pixel circuit located in an area other than the component area;

a connection wiring connecting the auxiliary display element to the auxiliary pixel circuit; and a pattern layer arranged between the substrate and the auxiliary display element to overlap the auxiliary display element, the pattern layer comprising a plurality of patterns having a concentric shape in a plan view, and wherein the connection wiring is disposed on a different layer than the auxiliary pixel electrode, and the connection wiring disposed in the component area includes a transparent conductive material.

19. The electronic device of claim 18, wherein the pattern layer comprises at least one of a metal material or an inorganic insulating material.

20. The electronic device of claim 18, wherein the plurality of patterns have a first line width and a first separation distance, and wherein a ratio between the first line width and the first separation distance ranges from 1:1 to 1:2.

21. The electronic device of claim 18, wherein the pattern layer is electrically connected to a wiring to which a constant voltage is applied, or is electrically connected to the auxiliary display element.

22. The electronic device of claim 18, wherein the auxiliary display element comprises an auxiliary counter electrode disposed on the auxiliary pixel electrode, and an auxiliary intermediate layer located between the auxiliary pixel electrode and the auxiliary counter electrode, and wherein a width of the pattern layer is less than or equal to a width of the auxiliary pixel electrode.

23. The electronic device of claim 18, wherein the pattern layer comprises: a first pattern layer comprising a metal material and a plurality of first patterns having a concentric shape; and a second pattern layer comprising an inorganic insulating material and having a concentric shape.

24. The electronic device of claim 18, wherein the pattern layer further comprises a plurality of connection patterns connecting adjacent patterns of the plurality of patterns.

* * * * *